(12) United States Patent
Ohguro

(10) Patent No.: US 8,735,999 B2
(45) Date of Patent: May 27, 2014

(54) SEMICONDUCTOR DEVICE

(75) Inventor: Tatsuya Ohguro, Yokohama (JP)

(73) Assignee: Kabushiki Kaisha Toshiba, Tokyo (JP)

(\*) Notice: Subject to any disclaimer, the term of this patent is extended or adjusted under 35 U.S.C. 154(b) by 121 days.

(21) Appl. No.: 13/355,901

(22) Filed: Jan. 23, 2012

(65) Prior Publication Data

US 2012/0205751 A1    Aug. 16, 2012

(30) Foreign Application Priority Data

Feb. 14, 2011    (JP) ................................. 2011-028759

(51) Int. Cl.
*H01L 29/76*    (2006.01)

(52) U.S. Cl.
USPC ..... 257/411; 257/386; 257/410; 257/E29.242

(58) Field of Classification Search
USPC ........................... 257/386, 410, 411, E29.242
See application file for complete search history.

(56) References Cited

U.S. PATENT DOCUMENTS

| 8,304,843 B2 | 11/2012 | Verhulst |
| 2007/0178650 A1 | 8/2007 | Chen et al. |
| 2011/0079860 A1 | 4/2011 | Verhulst |

FOREIGN PATENT DOCUMENTS

| JP | 5-190847 A | 7/1993 |
| JP | 7-263677 | 10/1995 |
| JP | 2011-100986 A | 5/2011 |

OTHER PUBLICATIONS

Japanese Office Action issued May 24, 2013 in Patent Application No. 2011-028759 with English Translation.
Chenming Hu, et al., "Green Transistor—A $V_{DD}$ Scaling Path for Future Low Power ICs,"VLSI—TSA International Symposium, Apr. 2008, 2 pages.
Sung Hwan Kim, et al., "Germanium-Source Tunnel Field Effect Transistors with Record High $I_{ON}/I_{OFF}$," Symposium on VLSI Technology Digest of Technical Papers, 2009, pp. 178-179.
Uygar E. Avci, et al., "Comparison of Performance, Switching Energy and Process Variations for the TFET and MOSFET in Logic," Symposium on VLSI Technology Digest of Technical Papers, 2011, pp. 124-125.

*Primary Examiner* — Andy Huynh
(74) *Attorney, Agent, or Firm* — Oblon, Spivak, McClelland, Maier & Neustadt, L.L.P.

(57) ABSTRACT

In one embodiment, a semiconductor device includes a substrate, and a gate electrode provided on the substrate via a gate insulator. The device further includes a source region of a first conductivity type and a drain region of a second conductivity type provided in the substrate to sandwich the gate electrode, and a channel region provided between the source and drain regions in the substrate. The gate insulator includes a first insulator portion having a first edge which is positioned on the source region and is parallel to a channel-width direction, and a second edge which is positioned on the channel or source region and is parallel to the channel-width direction, and having a first thickness. The gate insulator further includes a second insulator portion positioned on a drain region side with respect to the first insulator portion, and having a second thickness greater than the first thickness.

18 Claims, 17 Drawing Sheets

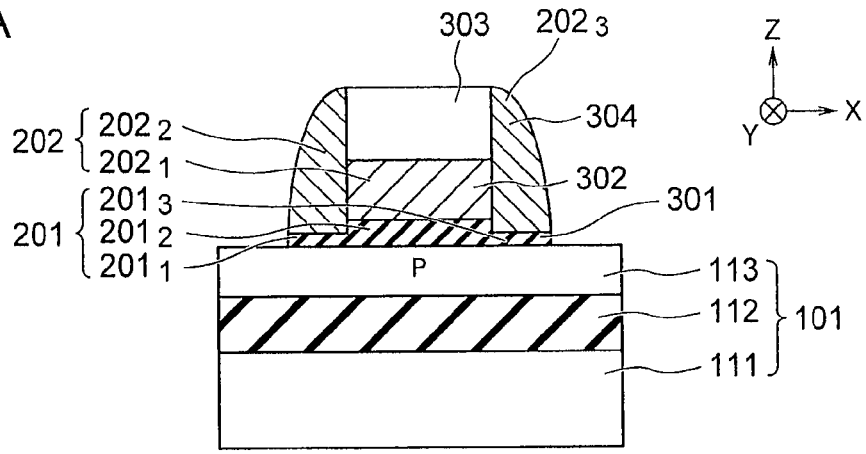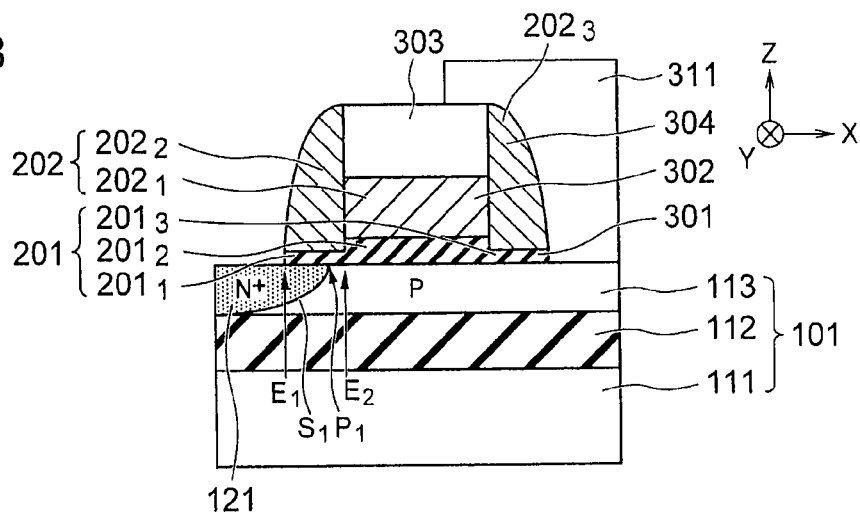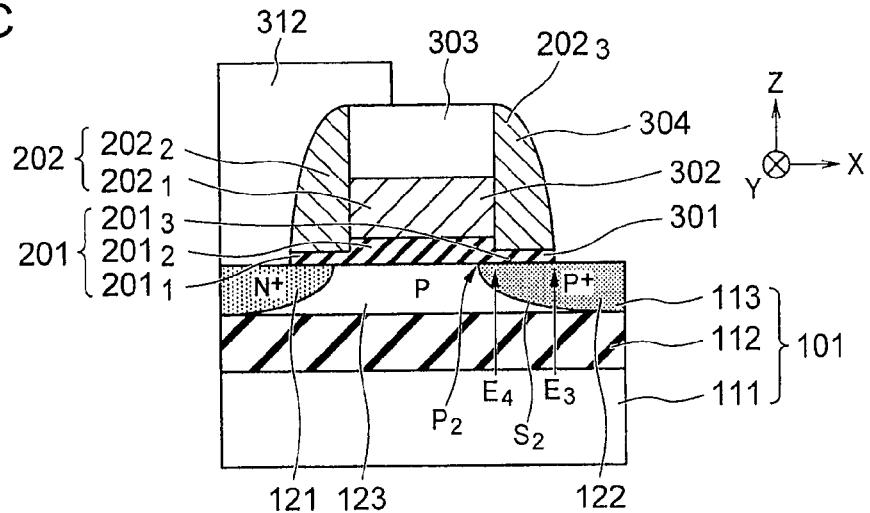

SEMICONDUCTOR DEVICE

CROSS REFERENCE TO RELATED APPLICATION

This application is based upon and claims the benefit of priority from the prior Japanese Patent Application No. 2011-28759, filed on Feb. 14, 2011, the entire contents of which are incorporated herein by reference.

FIELD

Embodiments described herein relate to a semiconductor device.

BACKGROUND

An example of effective methods for reducing the power consumption of an electronic device is to reduce the operation voltage of the device. However, if the operation voltage of a conventional MOS transistor is excessively reduced, a required current value cannot be availed, so that the operation speed of the transistor is significantly decreased.

Therefore, there has been considered a tunnel transistor in which a tunnel current flows through a PN junction between a source region and a channel region. The current value of the tunnel transistor is determined by the PN junction through which the tunnel current flows. Among the all portions of a gate electrode of the tunnel transistor, a portion in the vicinity of the PN junction contributes to the control of the tunnel current. On the other hand, a gate insulator of the tunnel transistor under the other portions of the gate electrode serves as a parasitic capacitor of the tunnel transistor. The parasitic capacitor causes a decrease In operation speed of the transistor. Therefore, it is desired to reduce the parasitic capacitance of the tunnel transistor.

BRIEF DESCRIPTION OF THE DRAWINGS

FIGS. 3A to 5C are cross-sectional views illustrating a method of manufacturing the semiconductor device of the first embodiment;

DETAILED DESCRIPTION

Embodiments will now be explained with reference to the accompanying drawings.

An embodiment described herein is a semiconductor device including a substrate, and a gate electrode provided on the substrate via a gate insulator. The device further includes a source region of a first conductivity type and a drain region of a second conductivity type provided in the substrate to sandwich the gate electrode, the second conductivity type being a reverse conductivity type of the first conductivity type, and a channel region provided between the source region and the drain region in the substrate. The gate insulator includes a first insulator portion having a first edge which is positioned on the source region and is parallel to a channel-width direction, and a second edge which is positioned on the channel region or the source region and is parallel to the channel-width direction, and having a first thickness. The gate insulator further includes a second insulator portion positioned on a drain region side with respect to the first insulator portion, and having a second thickness greater than the first thickness.

First Embodiment

Figure 1:
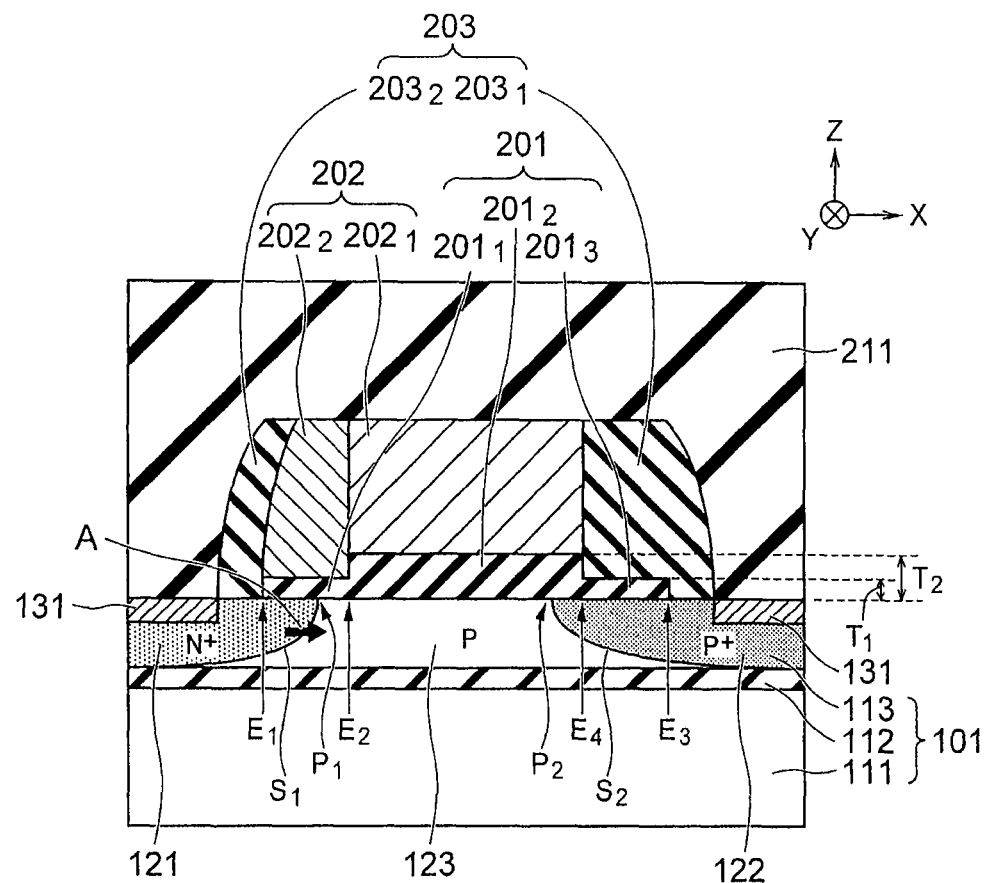
FIG. 1 is a cross-sectional view illustrating a structure of a semiconductor device of a first embodiment.

FIG. 1 is a cross-sectional view illustrating a structure of a semiconductor device of a first embodiment.

FIG. 1 illustrates a tunnel transistor forming the semiconductor device. As components of this tunnel transistor, the semiconductor device of FIG. 1 is provided with a substrate 101, a source region 121, a drain region 122, a channel region 123, a gate insulator 201, a gate electrode 202, sidewall insulators 203, and the like.

The substrate 101 is an SOI (Semiconductor On Insulator) substrate and includes a semiconductor substrate 111, a buried insulator 112 formed on the semiconductor substrate 111, and a semiconductor layer 113 formed on the buried insulator 112. In the present embodiment, the semiconductor substrate 111, the buried insulator 112, and the semiconductor layer 113 are a silicon substrate, a silicon oxide film, and a P-type silicon layer, respectively. The substrate 101 may be a semiconductor substrate instead of the SOI substrate.

FIG. 1 shows X, Y and Z directions orthogonal to one another. The X and Y directions are parallel to a principal surface of the substrate 101 and orthogonal to each other. The Z direction is perpendicular to the principal surface of the substrate 101. The X direction corresponds to a gate length direction of the tunnel transistor, and the Y direction corresponds to a channel width direction of the tunnel transistor.

The source region 121 and the drain region 122 are formed in the semiconductor layer 113, so as to sandwich the gate electrode 202. In addition, the channel region 123 is formed between the source region 121 and the drain region 122 in the semiconductor layer 113. In FIG. 1, an interfacial boundary between the source region 121 and the channel region 123 is denoted by $S_1$, and an interfacial boundary between the drain region 122 and the channel region 123 is denoted by $S_2$. In addition, leading ends of the interfacial boundaries $S_1$ and $S_2$, i.e., places where the interfacial boundaries $S_1$ and $S_2$ contact the principal surface of the substrate 101 are denoted by $P_1$ and $P_2$, respectively.

In the present embodiment, the conductivity type of the source region 121 is N and the conductivity types of the drain region 122 and the channel region 123 are P. Accordingly, the interfacial boundary $S_1$ between the source region 121 and the channel region 123 forms a PN junction (PN junction surface). The tunnel transistor of the present embodiment is configured so that upon application of a voltage to the gate electrode 202, a tunnel current flows through the PN junction $S_1$. An arrow A shown in FIG. 1 schematically shows the way carriers (electrons) of the tunnel current in the source region 121 flow into the channel region 123 through the PN junction $S_1$.

Note that specifically, the source region 121 and the drain region 122 are an N+ type region and a P+ type region, respectively. Also note that the channel region 123 is a P type region, and this stems from the semiconductor layer 113 being a P-type semiconductor layer. The source region 121, the drain region 122, and the channel region 123 may alternatively be a P+ type region, an N+ type region, and an N type region, respectively.

FIG. 1 further illustrates silicide layers 131 formed in the source region 121 and the drain region 122. These silicide layers 131 are formed in the vicinity of upper surfaces of the source region 121 and the drain region 122, so as to sandwich the gate electrode 202 and the sidewall insulators 203.

Next, a description will be given of the gate insulator 201, the gate electrode 202 and the sidewall insulators 203 forming the tunnel transistor.

The gate insulator 201 is formed on the substrate 101. The gate insulator 201 includes a first insulator portion $201_1$ having a first thickness $T_1$, a second insulator portion $201_2$ having a second thickness $T_2$ greater than the first thickness $T_1$, and a third insulator portion $201_3$ having the first thickness $T_1$.

The first insulator portion $201_1$ includes an edge $E_1$ parallel to the Y direction and positioned on the source region 121 and an edge $E_2$ parallel to the Y direction and positioned on the channel region 123. Accordingly, the first insulator portion $201_1$ is positioned on a leading end $P_1$ of the interfacial boundary $S_1$ (PN junction) between the source region 121 and the channel region 123. The edges $E_1$ and $E_2$ are examples of first and second edges, respectively.

In addition, the second insulator portion $201_2$ is adjacent to the first insulator portion $201_1$ and is positioned on the drain region 122 side with respect to the first insulator portion $201_1$. Likewise, the third insulator portion $201_3$ is adjacent to the second insulator portion $201_2$ and is positioned on the drain region 122 side with respect to the second insulator portion $201_2$. More detailedly, the third insulator portion $201_3$ includes an edge $E_3$ parallel to the Y direction and positioned on the drain region 122 and an edge $E_4$ parallel to the Y direction and also positioned on the drain region 122. Accordingly, the third insulator portion $201_3$ is positioned on the drain region 122 side with respect to the leading end $P_2$ of the interfacial boundary $S_2$ between the drain region 122 and the channel region 123.

In the present embodiment, the X-directional widths of the first, second and third insulator portions $201_1$, $201_2$ and $201_3$ are set to approximately 30 nm, 50 nm and 30 nm, respectively. The total X-directional width of the first and second insulator portions $201_1$ and $201_2$ is desirably set to 50 nm or greater, and is set to approximately 80 nm in the present embodiment. In the present embodiment, each of the X-directional widths of the first and third insulator portions $201_1$ and $201_3$ is set smaller than that of the second insulator portion $201_2$. Furthermore, the X-directional width of the third insulator portion $201_3$ is set substantially equal to that of the first insulator portion $201_1$.

In addition, the gate electrode 202 is formed on the substrate 101 via the gate insulator 201. The gate electrode 202 includes a first electrode portion $202_1$ formed on the second insulator portion $201_2$ and a second electrode portion $202_2$ formed on the first insulator portion $201_1$ as a sidewall film of the first electrode portion $202_1$.

In addition, the sidewall insulators 203 are formed on two sidewall surfaces of the gate electrode 202 which are parallel to the Y direction. As the sidewall insulators 203, FIG. 1 illustrates a first sidewall insulator $203_1$ formed on a sidewall surface of the second electrode portion $202_2$ side on the third insulator portion $201_3$, and a second sidewall insulator $203_2$ formed on a sidewall surface of the first electrode portion $202_1$ side.

FIG. 1 further illustrates an inter layer dielectric 211 formed on the substrate 101 so as to cover the tunnel transistor. The inter layer dielectric 211 is, for example, a silicon oxide film.

Figure 2:
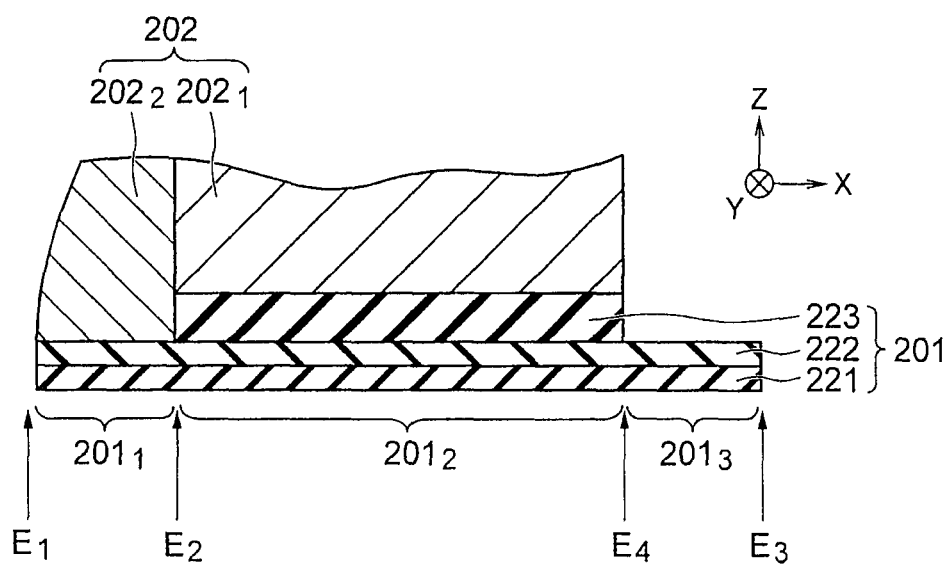
FIG. 2 is an enlarged cross-sectional view illustrating a detailed structure of a gate insulator in FIG. 1.

FIG. 2 is an enlarged cross-sectional view illustrating a detailed structure of the gate insulator 201 in FIG. 1.

The gate insulator 201 has a structure in which a first gate insulator 221 of a thin silicon oxide film, a second gate insulator 222 of a high-k insulator, and a third gate insulator 223 of a thick silicon oxide film are sequentially stacked. The thin and thick silicon oxide films are examples of first and second insulators, respectively. In the present embodiment, the second gate insulator 222 is an $HfO_2$ (hafnium oxide) film, and the thickness of the first gate insulator 221 is set to, for example, 1.5 nm.

As illustrated in FIG. 2, the first insulator portion $201_1$ and the third insulator portion $201_3$ are formed of the first and second gate insulators 221 and 222. On the other hand, the second insulator portion $201_2$ is formed of the first to third gate insulators 221 to 223. Consequently, the thickness of the second insulator portion $201_2$ is greater than the thicknesses of the first insulator portion $201_1$ and the third insulator portion $201_3$.

As described above, in the present embodiment, the first and third insulator portions $201_1$ and $201_3$ are respectively formed of insulating layers composed of "$N_1$" layers ("$N_1$" is an integer equal to or larger than 1) and the second insulator portion $201_2$ is formed of insulating layers composed of "$N_1$"+"$N_2$" layers ("$N_2$" is an integer equal to or larger than 1). In FIG. 2, "$N_1$"=2 and "$N_2$"=1.

Note that details on a method of processing the first to third gate insulators 221 to 223 to form the gate insulator 201 will be described later.

(1) Effects of Semiconductor Device of First Embodiment

Next, effects of the semiconductor device of the first embodiment will be described by referring again to FIG. 1.

The second electrode portion $202_2$, among the constituent parts of the gate electrode 202, is positioned on the leading end $P_1$ of the PN junction $S_1$. On the other hand, the first electrode portion $202_1$ is positioned toward the channel region 123 side from the leading end $P_1$ of the PN junction $S_1$. Accordingly, the second electrode portion $202_2$ is, on the whole, positioned closer to the PN junction $S_1$ than the first electrode portion $202_1$.

Consequently, the second electrode portion $202_2$, among the constituent parts of the gate electrode 202, plays a major part in the control of a tunnel current in the present embodiment. On the other hand, the first electrode portion $202_1$ is less involved in the tunnel current control. Therefore, the gate insulator 201 below the first electrode portion $202_1$ serves as a parasitic capacitor of the tunnel transistor, thereby contributing to a decrease in operation speed of the tunnel transistor.

However, the gate insulator 201 of the present embodiment includes the first insulator portion $201_1$ having the first thickness $T_1$, the second insulator portion $201_2$ having the second thickness $T_2$ greater than the first thickness $T_1$, and the like. In addition, the first and second electrode portions $202_1$ and $202_2$ are formed on the second and first insulator portions $201_2$ and $201_1$, respectively. In other words, in the present embodiment, the gate insulator 201 below the first electrode portion 202₁ is made thicker in thickness than the gate insulator 201 below the second electrode portion 202₂.

Consequently, in the present embodiment, the parasitic capacitance of the tunnel transistor ascribable to the gate insulator 201 below the first electrode portion 202₁ is reduced, thereby realizing an improvement in operation speed of the tunnel transistor.

(2) Method of Manufacturing Semiconductor Device of First Embodiment

Next, a method of manufacturing the semiconductor device of the first embodiment will be described with reference to FIGS. 3A to 5C. FIGS. 3A to 5C are cross-sectional views illustrating the method of manufacturing the semiconductor device of the first embodiment.

Figure 3A:
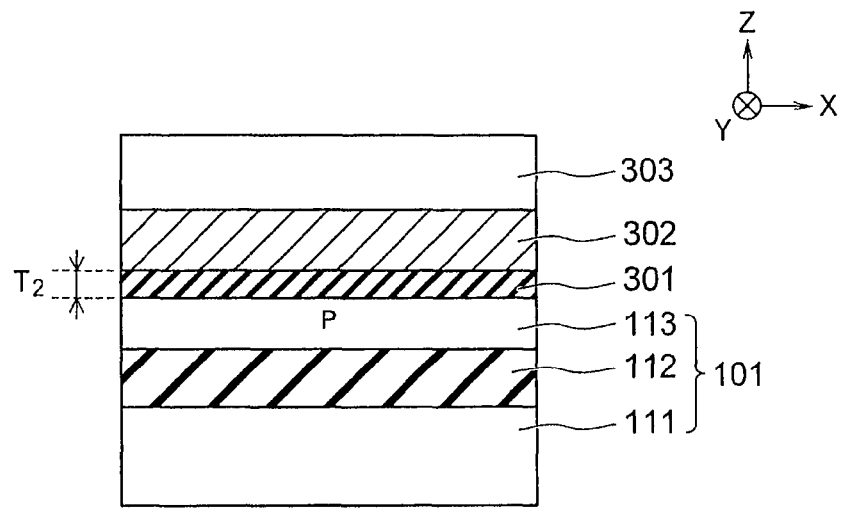

First, as illustrated in FIG. 3A, there is prepared the substrate 101 which is an SOI substrate. Next, as illustrated in FIG. 3A, a gate insulator material 301 to serve as the material of the first to third insulator portions 201₁ to 201₃, a first gate electrode material 302 to serve as the material of the first electrode portion 202₁, and a hard mask material 303 are sequentially formed on the substrate 101.

The gate insulator material 301 is formed by sequentially forming, on the substrate 101, a thin $SiO_2$ film to serve as the material of the first gate insulator 221, an $HfO_2$ film to serve as the material of the second gate insulator 222, and a thick $SiO_2$ film to serve as the material of the third gate insulator 223. In the present embodiment, the thin $SiO_2$ film, the $HfO_2$ film, and the thick $SiO_2$ film are formed by means of thermal oxidation, sputtering or ALD (Atomic Layer Deposition), and CVD (Chemical Vapor Deposition), respectively. In addition, the thickness of the thin $SiO_2$ film is set to, for example, 1.5 nm. The thickness of the gate insulator material 301 is set to the second thickness $T_2$.

In the present embodiment, the substrate 101 is annealed at a temperature of 600° C. or higher after the $HfO_2$ film or the thick $SiO_2$ film is deposited. If the $HfO_2$ film is crystallized by annealing at a temperature of 600° C. or higher, the $HfO_2$ film has the property that etching does not progress even if the $HfO_2$ film is soaked in a treatment liquid containing hydrofluoric acid for removing $SiO_2$-containing films.

In addition, in the present embodiment, an Si-containing material previously doped with an N or P-type impurity, for example, is used as the first gate electrode material 302. In this case, an $SiO_2$ film or an SiN film, for example, is used as the hard mask material 303. Such a hard mask material 303 prevents ions from being implanted into the first gate electrode material 302 formed of the Si-containing material at the time of ion implantation into the source region 121 or the drain region 122. This prevents the first gate electrode material 302 from going into depletion. Note that a metal material may alternatively be used as the first gate electrode material 302. In this case, it does not matter if the hard mask material 303 is not deposited on the first gate electrode material 302.

Figure 3B:
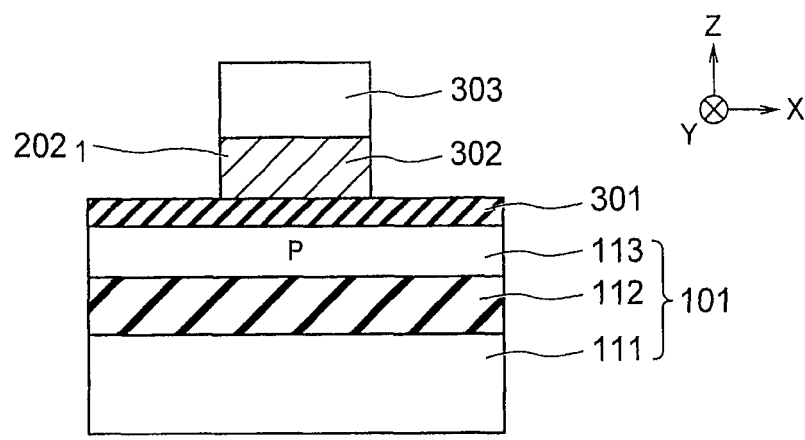

Next, as illustrated in FIG. 3B, the hard mask material 303 is patterned. Next, as illustrated in FIG. 3B, the first gate electrode material 302 is patterned using the hard mask material 303 as a mask to form the first electrode portion 202₁.

Figure 3C:
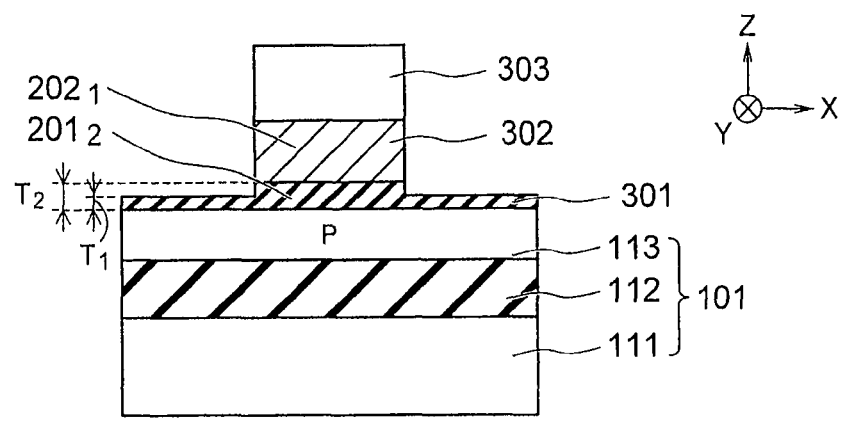

Next, the gate insulator material 301 is wet-processed using a treatment liquid containing hydrofluoric acid. In this wet processing, a portion of the thick $SiO_2$ film covered with the first gate electrode material 302 is not etched, but a portion of the thick $SiO_2$ film not covered with the first gate electrode material 302 is etched, as illustrated in FIG. 3C. Accordingly, the $HfO_2$ film below the thick $SiO_2$ film becomes exposed.

Consequently, the thickness of the portion of the gate insulator material 301 covered with the first gate electrode material 302 is maintained at the second thickness $T_2$, and the gate insulator material 301 serves as the second insulator portion 201₂. On the other hand, the thickness of the portion of the gate insulator material 301 not covered with the first gate electrode material 302 decreases to the first thickness $T_1$.

Note that it does not matter if the treatment liquid gets into under the first gate electrode material 302 at the time of the wet processing, thereby etching part of the thick $SiO_2$ film below the first gate electrode material 302. Such wet processing will be described later in a second embodiment.

Next, as illustrated in FIG. 4A, a second gate electrode material 304 is deposited on the substrate 101, and this second gate electrode material 304 is etched. Consequently, the second electrode portion 202₂ is formed on one sidewall surface of the first electrode portion 202₁ as a sidewall film. In addition, a third electrode portion 202₃ is formed on the other sidewall surface of the first electrode portion 202₁ as another sidewall film. Additionally, the gate insulator material 301 is etched to form the first and third insulator portions 201₁ and 201₃. As the second gate electrode material 304, an Si-containing material previously doped with an N or P-type impurity or a metal material, for example, is used.

Note that an oxide film is formed on the sidewall surfaces of the first gate electrode material 302 during a period from the patterning of the first gate electrode material 302 to the deposition of the second gate electrode material 304. This oxide film is removed by the wet processing, however. Accordingly, the second gate electrode material 304 is electrically connected to a sidewall surface of the first gate electrode material 302. Consequently, one gate electrode 202 is formed of the first and second gate electrode materials 302 and 304.

Next, as illustrated in FIG. 4B, a third electrode portion 202₃-side part of the substrate 101, i.e., a region in which the drain region 122 is to be formed is masked by a resist film 311. Next, an N-type impurity is ion-implanted into a second electrode portion 202₂-side part of the substrate 101, i.e., a region in which the source region 121 is to be formed. Consequently, the source region 121 is formed in the substrate 101. Thereafter, the resist film 311 is separated off.

Note that an acceleration voltage and a dose amount in ion implantation are adjusted as appropriate, so that the leading end $P_1$ of the source region 121 does not extend beyond a location below the second electrode portion 202₂ to below the first electrode portion 202₁ at the time of ion implantation in FIG. 4B. Consequently, the edge $E_2$ of the first insulator portion 201₁ is positioned on the channel region 123. Note that the leading end $P_1$ of the source region 121 does not desirably extend to below the first electrode portion 202₁, as described above. It does not matter, however, if the leading end $P_1$ extends to below the first electrode portion 202₁, unless the leading end $P_1$ extends far beyond a location below the edge $E_2$ of the first insulator portion 201₁.

Next, as illustrated in FIG. 4C, the second electrode portion 202₂-side part of the substrate 101, i.e., the region in which the source region 121 has been formed is masked by a resist film 312. Next, a P-type impurity is ion-implanted into a third electrode portion 202₃-side part of the substrate 101, i.e., a region in which the drain region 122 is to be formed. Consequently, the drain region 122 is formed in the substrate 101. A region between the source region 121 and the drain region 122 in the substrate 101 serves as the channel region 123.

Note that an acceleration voltage and a dose amount in ion implantation are adjusted as appropriate, so that the leading end $P_2$ of the drain region 122 extends beyond a location below the third insulator portion $201_3$ to below the second insulator portion $201_2$ at the time of ion implantation in FIG. 4C. Consequently, the edge $E_4$ of the third insulator portion $201_3$ is positioned on the drain region 122. Note that the leading end $P_2$ of the drain region 122 desirably extends to below the second insulator portion $201_2$, as described above. It does not matter, however, if the leading end $P_2$ does not extend to below the second insulator portion $201_2$.

Figure 5A:
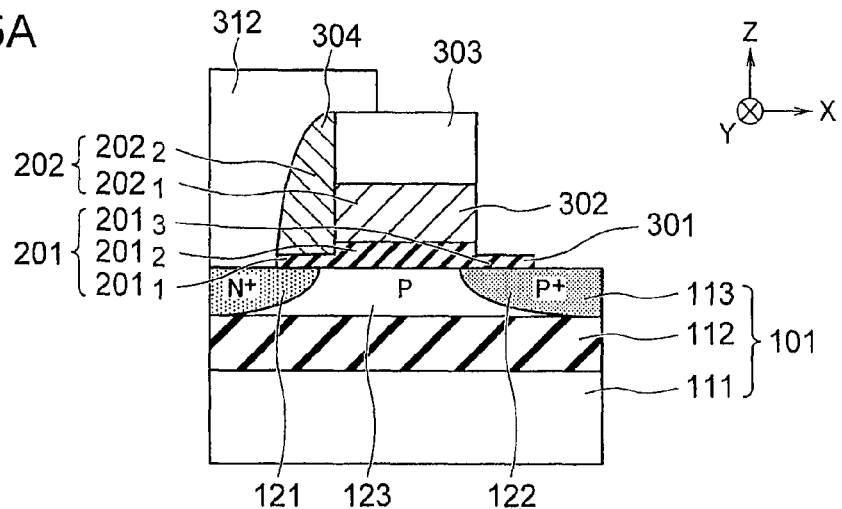

Next, as illustrated in FIG. 5A, the third electrode portion $202_3$ is removed using the resist film 312 described above as a mask. Thereafter, the resist film 312 is separated off.

Figure 5B:
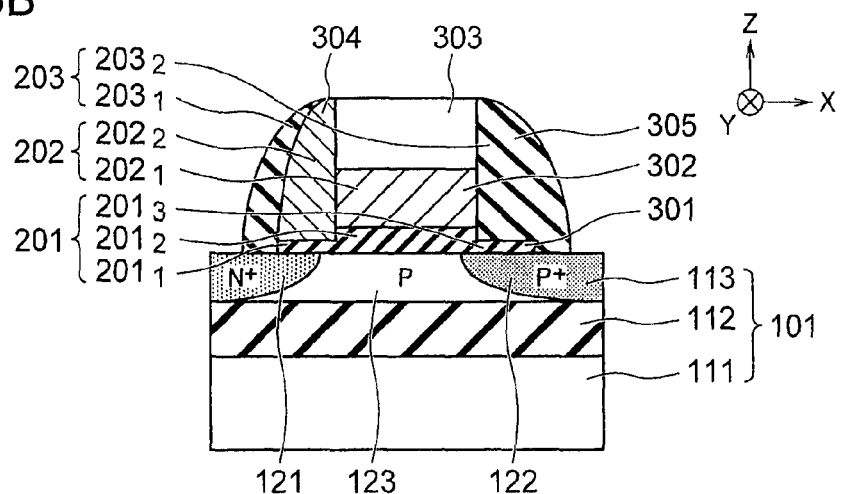

Next, as illustrated in FIG. 5B, a sidewall insulator material 305 is deposited on the substrate 101, and this sidewall insulator material 305 is etched. Consequently, the first sidewall insulator $203_1$ is formed on a second electrode portion $202_2$-side sidewall surface of the two sidewall surfaces of the gate electrode 202 and the hard mask material 303, and the second sidewall insulator $203_2$ is formed on a first electrode portion $202_1$-side sidewall surface of the two sidewall surfaces. In the present embodiment, an $SiO_2$ film or an SiN film, for example, is used as the sidewall insulator material 305.

Figure 5C:
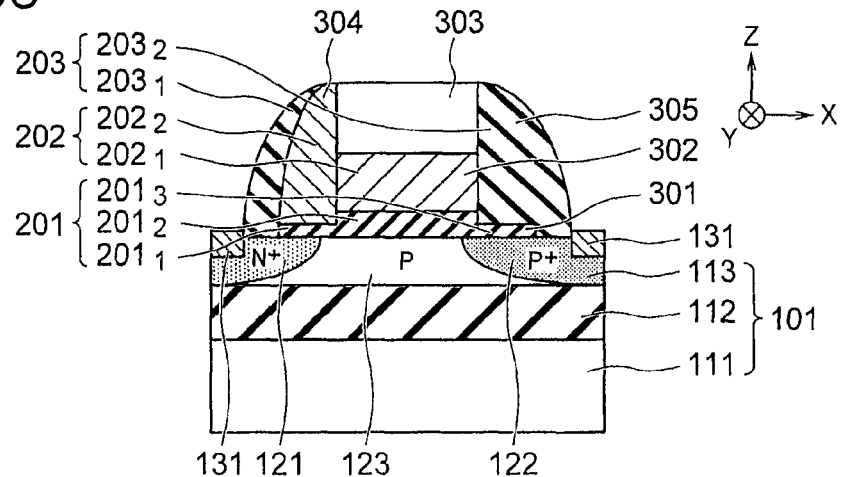

Next, as illustrated in FIG. 5C, a silicide layer 131 is formed in the vicinity of upper surfaces of the source region 121 and the drain region 122 by a salicide process. Consequently, it is possible to reduce the resistance of the source and drain of the tunnel transistor.

Thereafter, in the present embodiment, an inter layer dielectric is deposited on the substrate 101 and a surface of this inter layer dielectric is planarized by CMP (Chemical Mechanical Polishing). Consequently, the hard mask material 303 is removed and upper portions of the second electrode portion $202_2$ and the sidewall insulators 203 are abraded, thereby completing the tunnel transistor illustrated in FIG. 1. In addition, contact plugs, via plugs, line layers, inter layer dielectrics, and the like are formed on the substrate 101 by a known method or the like to complete the semiconductor device of FIG. 1.

As has been described heretofore, in the present embodiment, the gate insulator 201 is composed of the first insulator portion $201_1$ having the first thickness $T_1$, the second insulator portion $201_2$ having the second thickness $T_2$ greater than the first thickness $T_1$, and the like. In addition, the thickness of a portion of the gate insulator 201 farther from the PN junction $S_1$ is made greater than the thickness of a portion of the gate insulator 201 closer to the PN junction $S_1$. Consequently, in the present embodiment, it is possible to reduce the parasitic capacitance of the tunnel transistor and thereby improve the operation speed of the transistor.

Note that in the present embodiment, the cross-sectional shape of the gate insulator 201 in the cross-section parallel to the X direction is bilaterally symmetrical (see FIG. 1). It does not matter, however, if the cross-sectional shape of the gate insulator 201 is bilaterally asymmetrical. For example, the width and thickness of the first insulator portion $201_1$ may be different from those of the third insulator portion $201_3$. In addition, the gate insulator 201 may be composed only of the first and second Insulator portions $201_1$ and $201_2$.

Additionally, the channel region 123, though formed as an N type region in the present embodiment, may be a P type region or an i-type (intrinsic) region.

Hereinafter, a description will be given of second to fourth embodiments which are modified examples of the first embodiment. The second to fourth embodiments will be described with a focus on the differences from the first embodiment.

Second Embodiment

Figure 6:
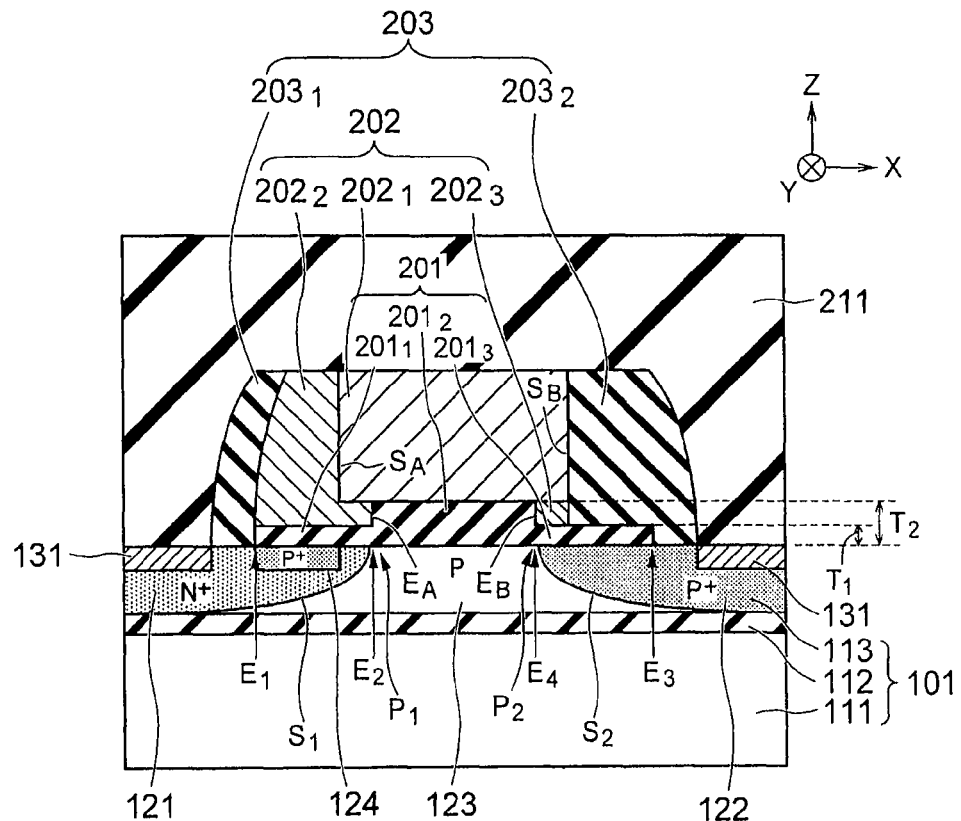
FIG. 6 is a cross-sectional view illustrating a structure of a semiconductor device of a second embodiment.

FIG. 6 is a cross-sectional view illustrating a structure of a semiconductor device of the second embodiment.

In FIG. 6, an edge $E_A$ of a second insulator portion $201_2$ parallel to the Y direction is recessed toward the inner side of a first electrode portion $202_1$ with respect to a side surface $S_A$ of the first electrode portion $202_1$ parallel to the Y direction. A part of the second electrode portion $202_2$ is buried in the space where the edge $E_A$ of the second insulator portion $201_2$ is recessed with respect to the side surface $S_A$ of the first electrode portion $202_1$. The side surface $S_A$ is an example of a first side surface.

Also in FIG. 6, an edge $E_B$ of the second insulator portion $201_2$ parallel to the Y direction is recessed toward the inner side of the first electrode portion $202_1$ with respect to a side surface $S_B$ of the first electrode portion $202_1$ parallel to the Y direction. A part of the third electrode portion $202_2$ described in FIG. 4A is buried in the space where the edge $E_B$ of the second insulator portion $201_2$ is recessed with respect to the side surface $S_B$ of the first electrode portion $202_1$. The side surface $S_B$ is an example of a second side surface.

The recession of the edges $E_A$ and $E_B$ is due to a treatment liquid getting into under the first electrode portion $202_1$ at the time of wet processing in FIG. 3C, thereby etching part of a thick $SiO_2$ film below the first electrode portion $202_1$. Details on this etching will be discussed when describing a method of manufacturing the semiconductor device of the present embodiment.

Also in FIG. 6, a pocket region 124 is formed in the source region 121 below the gate electrode 202. The pocket region 124 is a P+ type region and is formed in the vicinity of an upper surface of the source region 121. The pocket region 124 has the effect of improving the tunneling efficiency of the tunnel transistor and increasing the current value of the tunnel current.

Note that in the second embodiment, it does not matter if the pocket region 124 is not formed in the source region 121. On the other hand, in the first embodiment, the pocket region 124 may be formed in the source region 121 as in the second embodiment.

Figure 7:
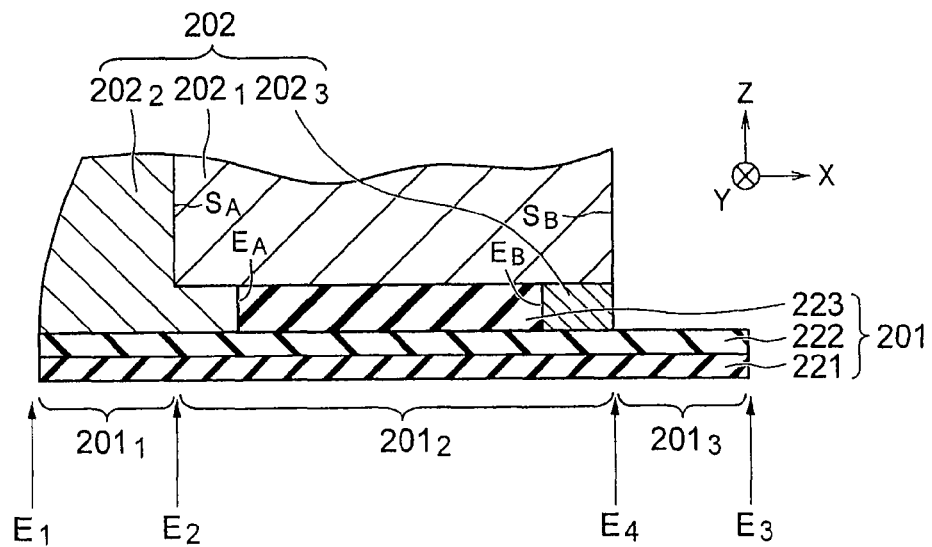
FIG. 7 is an enlarged cross-sectional view illustrating a detailed structure of a gate insulator in FIG. 6.

FIG. 7 is an enlarged cross-sectional view detailedly illustrating a structure of the gate insulator 201 shown in FIG. 6.

The gate insulator 201 of the second embodiment has a structure in which a first gate insulator 221 which is a thin silicon oxide film, a second gate insulator 222 which is a high-k insulator, and a third gate insulator 223 which is a thick silicon oxide film are sequentially stacked as in the first embodiment. It should be noted, however, that the edges $E_A$ and $E_B$ of the second insulator portion $201_2$ are recessed, respectively, with respect to the side surfaces $S_A$ and $S_B$ of the first electrode portion $202_1$.

(1) Effects of Semiconductor Device of Second Embodiment

Next, effects of the semiconductor device of the second embodiment will be described by referring again to FIG. 6.

In the present embodiment, the gate insulator 201 below the first electrode portion $202_1$ is made thicker in thickness than the gate insulator 201 below the second electrode portion $202_2$, as in the first embodiment. Consequently, in the present embodiment, the parasitic capacitance of the tunnel transistor ascribable to the gate insulator 201 below the first electrode portion $202_1$ is reduced, thereby realizing an improvement in the operation speed of the tunnel transistor, as in the first embodiment.

In addition, in the present embodiment, the pocket region 124 is formed in the source region 121 below the gate electrode 202. Consequently, in the present embodiment, the tunneling efficiency of the tunnel transistor is improved, thereby bringing about an increase in the current value of the tunnel current.

(2) Method of Manufacturing Semiconductor Device of Second Embodiment

Next, a method of manufacturing the semiconductor device of the second embodiment will be described with reference to FIGS. 8A to 10C. FIGS. 8A to 10C are cross-sectional views illustrating the method of manufacturing the semiconductor device of the second embodiment.

Figure 8A:
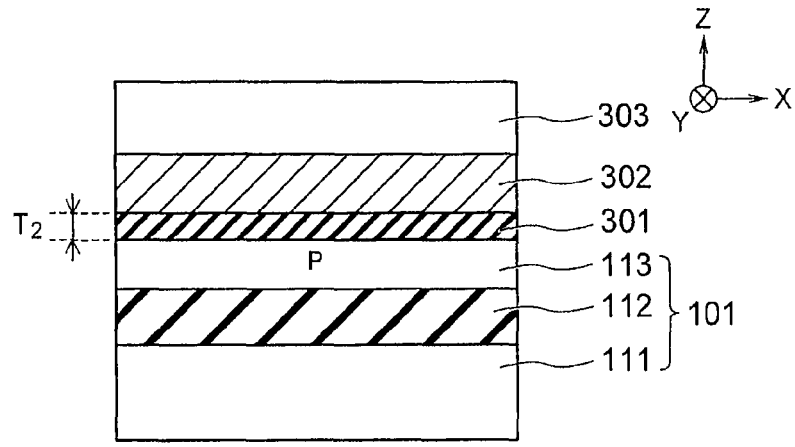
FIGS. 8A to 10C are cross-sectional views illustrating a method of manufacturing the semiconductor device of the second embodiment.

First, as illustrated in FIG. 8A, there is prepared a substrate 101 which is an SOI substrate. Next, as illustrated in FIG. 8A, a gate insulator material 301, a first gate electrode material 302, and a hard mask material 303 are sequentially formed on the substrate 101.

The gate insulator material 301 is formed by sequentially forming, on the substrate 101, a thin $SiO_2$ film to serve as the material of the first gate insulator 221, an $HfO_2$ film to serve as the material of the second gate insulator 222, and a thick $SiO_2$ film to serve as the material of the third gate insulator 223.

In the present embodiment, the substrate 101 is annealed at a temperature of 600° C. or higher after the $HfO_2$ film or the thick $SiO_2$ film is deposited, as in the first embodiment. If the $HfO_2$ film is crystallized by annealing at a temperature of 600° C. or higher, the $HfO_2$ film has the property that etching does not progress even if the $HfO_2$ film is soaked in a treatment liquid containing hydrofluoric acid for removing $SiO_2$-containing films.

Figure 8B:
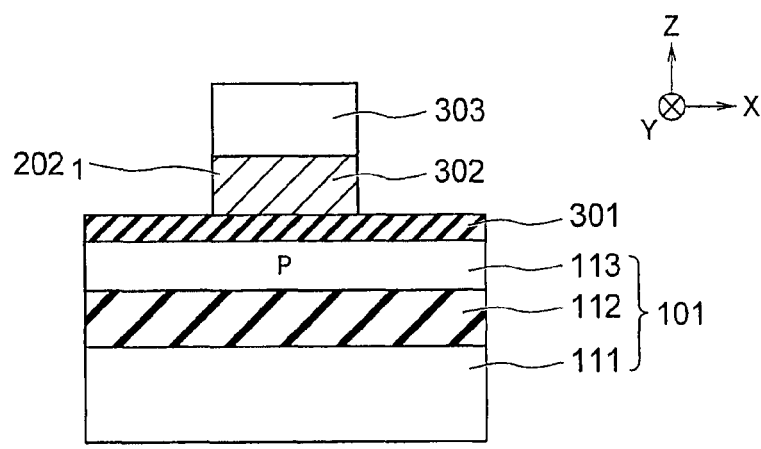

Next, as illustrated in FIG. 8B, the hard mask material 303 is patterned. Next, as illustrated in FIG. 8B, the first gate electrode material 302 is patterned using the hard mask material 303 as a mask to form the first electrode portion $202_1$.

Figure 8C:
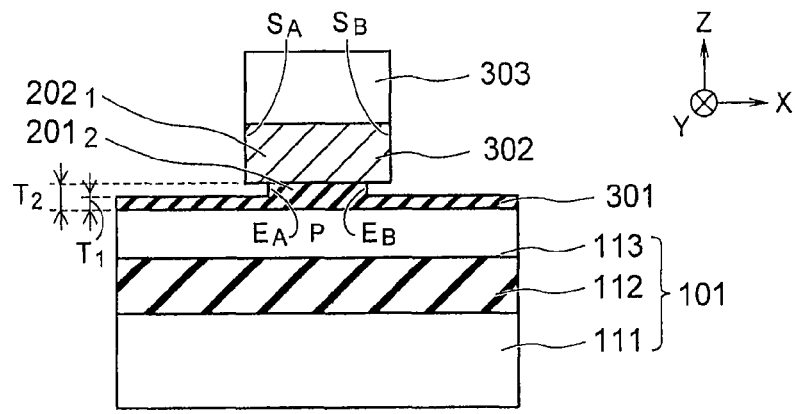

Next, the gate insulator material 301 is wet-processed using a treatment liquid containing hydrofluoric acid. In this wet processing, a portion of the thick $SiO_2$ film covered with the first gate electrode material 302 is not etched, but a portion of the thick $SiO_2$ film not covered with the first gate electrode material 302 is etched, as illustrated in FIG. 8C. Accordingly, the $HfO_2$ film below the thick $SiO_2$ film becomes exposed. Note that this wet processing is performed so that the treatment liquid gets into under the first gate electrode material 302 and etches part of the thick $SiO_2$ film below the first gate electrode material 302. Consequently, the edges $E_A$ and $E_B$ of the second insulator portion $201_2$ are recessed, respectively, with respect to the side surfaces $S_A$ and $S_B$ of the first electrode portion $202_1$.

Figure 9A:
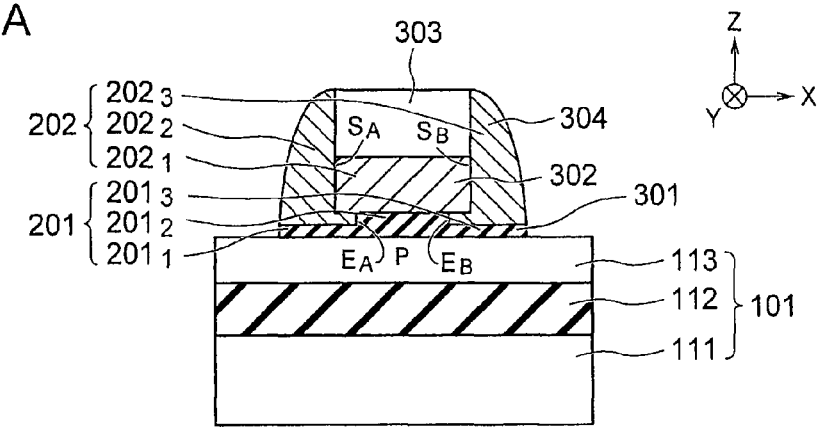

Next, as illustrated in FIG. 9A, a second gate electrode material 304 is deposited on the substrate 101, and this second gate electrode material 304 is etched. Consequently, the second electrode portion $202_2$ is formed on one sidewall surface of the first electrode portion $202_1$ as a sidewall film. In addition, a third electrode portion $202_3$ is formed on the other sidewall surface of the first electrode portion $202_1$ as another sidewall film. Additionally, the gate insulator material 301 is etched to form the first and third insulator portions $201_1$ and $201_3$.

Note that in the step of FIG. 9A, the second and third electrode portions $202_2$ and $202_3$ are buried in the spaces where the edges $E_A$ and $E_B$ of the second insulator portion $201_2$ are recessed, respectively.

Figure 9B:
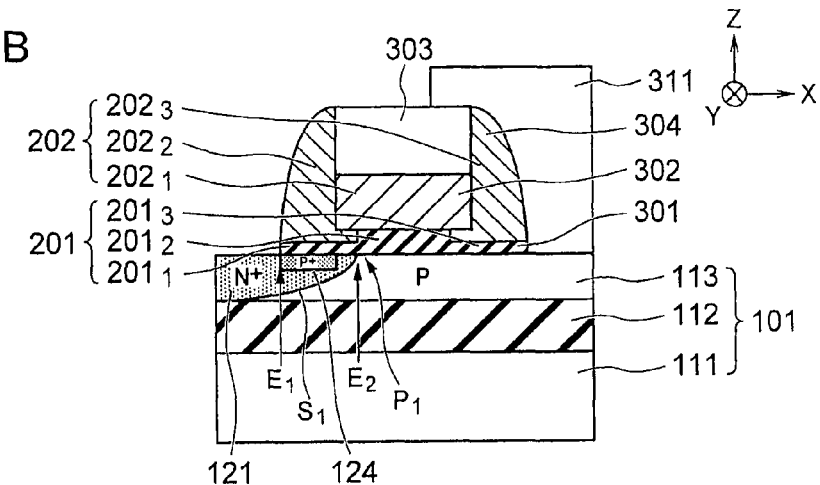

Next, as illustrated in FIG. 9B, a third electrode portion $202_3$-side part of the substrate 101, i.e., a region in which the drain region 122 is to be formed is masked by a resist film 311. Next, a P-type impurity is ion-implanted into a second electrode portion $202_2$-side part of the substrate 101, i.e., a region in which the source region 121 is to be formed. Then, an N-type impurity is ion-implanted into the portion. Consequently, the pocket region 124 and the source region 121 are formed in the substrate 101. Note that the pocket region 124 is basically formed in a region ranging from a location below the edge $E_1$ to a location below the side surface $S_A$. Thereafter, the resist film 311 is separated off.

Note that at the time of ion implantation in FIG. 9B, an acceleration voltage and a dose amount, for example, in the ion implantation are adjusted as appropriate, so that the leading end $P_1$ of the source region 121 does not extend beyond a location below the second electrode portion $202_2$ to below the first electrode portion $202_1$. Consequently, the edge $E_2$ of the first insulator portion $201_1$ is positioned on the channel region 123. Note that the leading end $P_1$ of the source region 121 does not desirably extend to below the first electrode portion $202_1$, as described above. It does not matter, however, if the leading end $P_1$ extends to below the first electrode portion $202_1$, unless the leading end $P_1$ extends far beyond a location below the edge $E_2$ of the first insulator portion $201_1$. It should be noted that a distance between the edge $E_1$ and the edge $E_2$ is longer in the present embodiment than in the first embodiment, and therefore, a high acceleration voltage is required to extend the leading end $P_1$ to below the edge $E_2$.

Figure 9C:
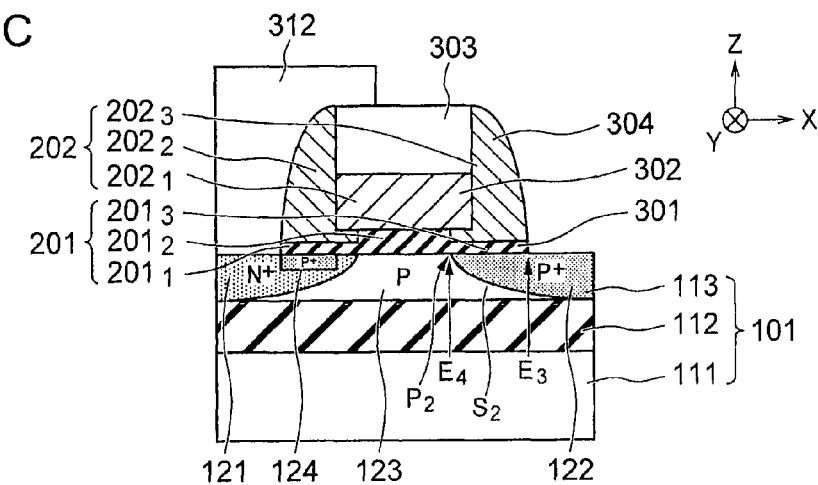

Next, as illustrated in FIG. 9C, the second electrode portion $202_2$-side part of the substrate 101, i.e., the region in which the source region 121 has been formed is masked by a resist film 312. Next, a P-type impurity is ion-implanted into a third electrode portion $202_3$-side part of the substrate 101, i.e., a region in which the drain region 122 is to be formed. Consequently, the drain region 122 is formed in the substrate 101. A region between the source region 121 and the drain region 122 in the substrate 101 serves as the channel region 123.

Note that at the time of ion implantation in FIG. 9C, an acceleration voltage and a dose amount, for example, in the ion implantation are adjusted as appropriate, so that the leading end $P_2$ of the drain region 122 extends beyond a location below the third insulator portion $201_3$ to below the second insulator portion $201_2$. Consequently, the edge $E_4$ of the third insulator portion $201_3$ is positioned on the drain region 122. Note that the leading end $P_2$ of the drain region 122 desirably extends to below the second insulator portion $201_2$, as described above. It does not matter, however, if the leading end $P_2$ does not extend to below the second insulator portion $201_2$.

Figure 10A:
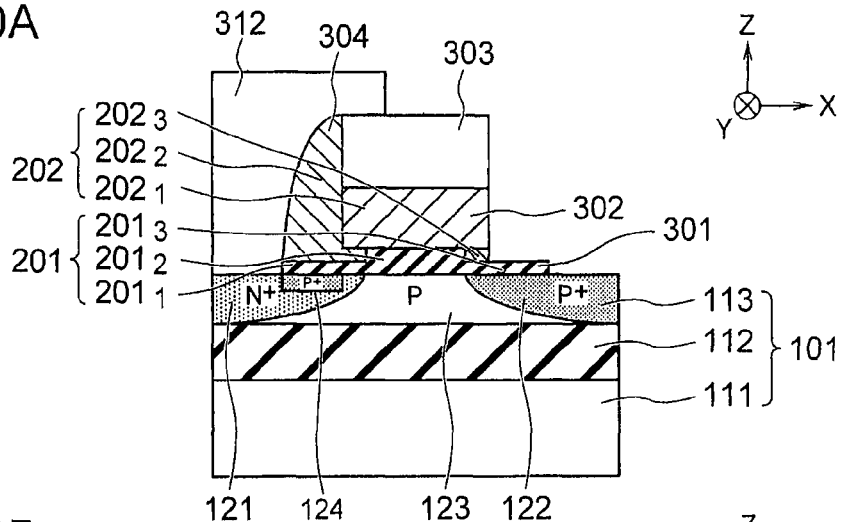

Next, as illustrated in FIG. 10A, the third electrode portion $202_3$ is removed using the resist film 312 as a mask. At this time, among the portions of the third electrode portion $202_3$, only the portion buried in the space where the edge $E_B$ of the second insulator portion $201_2$ is recessed remains as is without being removed. Thereafter, the resist film 312 is separated off.

Figure 10B:
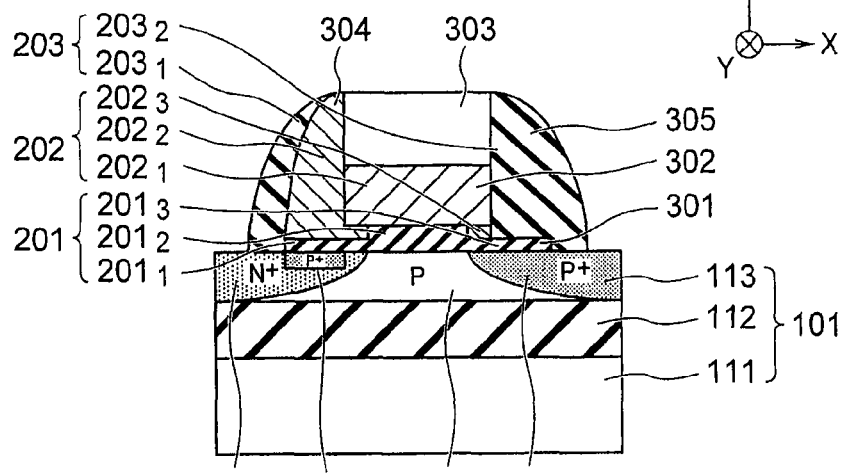
Figure 10C:
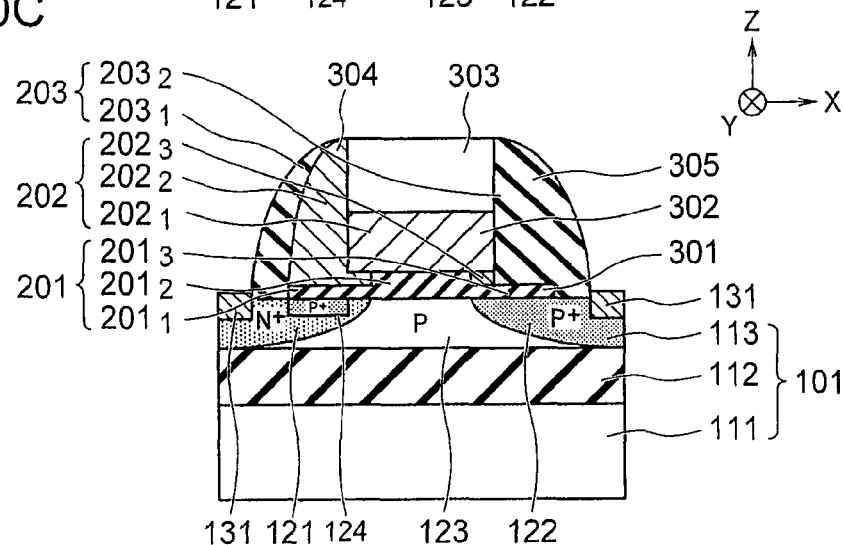

Subsequently, a step of FIG. 10B and subsequent steps are carried out in the same way as the step of FIG. 5B and subsequent steps in the first embodiment. In this way, the semiconductor device of FIG. 6 is completed.

As has been described heretofore, in the present embodiment, the gate insulator 201 is composed of the first insulator portion $201_1$ having the first thickness $T_1$, the second insulator portion $201_2$ having the second thickness $T_2$ greater than the first thickness $T_1$, and the like, as in the first embodiment. In addition, the thickness of a portion of the gate insulator 201 farther from the PN junction $S_1$ is made greater than the thickness of a portion of the gate insulator 201 closer to the PN junction $S_1$. Consequently, in the present embodiment, it is possible to reduce the parasitic capacitance of the tunnel transistor and thereby improve the operation speed of the transistor.

In addition, in the present embodiment, the pocket region 124 is formed in the source region 121 below the gate electrode 202. Consequently, in the present embodiment, it is possible to improve the tunneling efficiency of the tunnel transistor and increase the current value of the tunnel current.

Note that the structure in which the pocket region 124 is formed in the source region 121 is also applicable to third and fourth embodiments to be described hereinafter.

Third Embodiment

Figure 11:
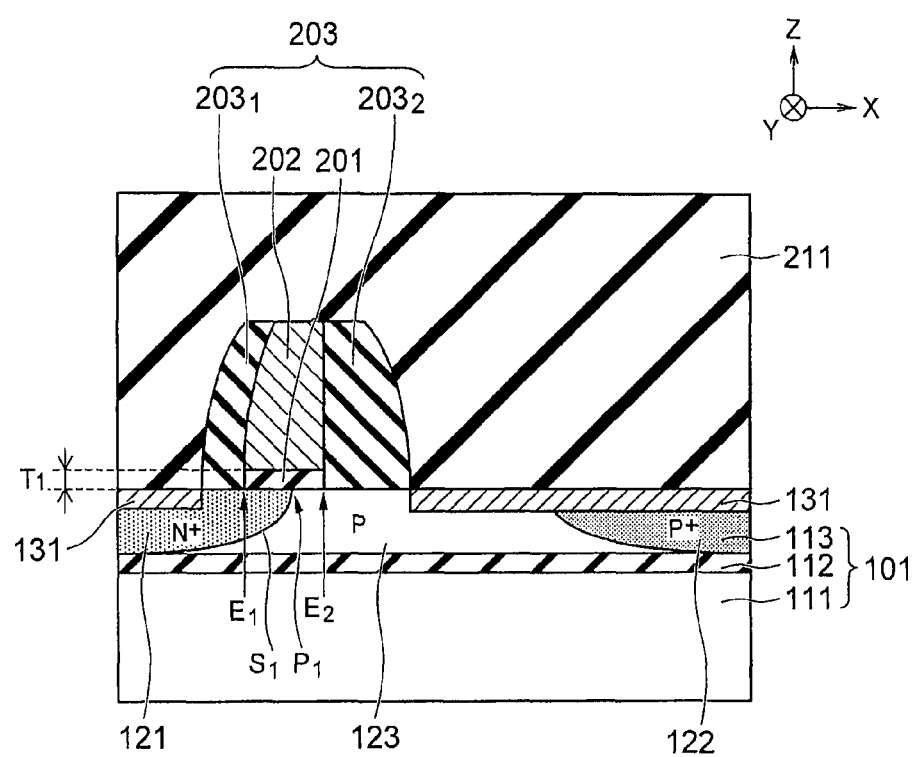
FIG. 11 is a cross-sectional view illustrating a structure of a semiconductor device of a third embodiment.
Figure 12A:
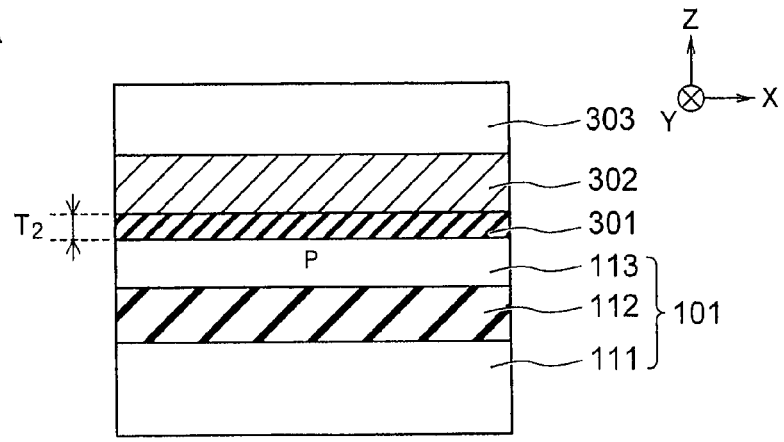
FIGS. 12A to 15 are cross-sectional views illustrating a method of manufacturing the semiconductor device of the third embodiment.
Figure 12B:
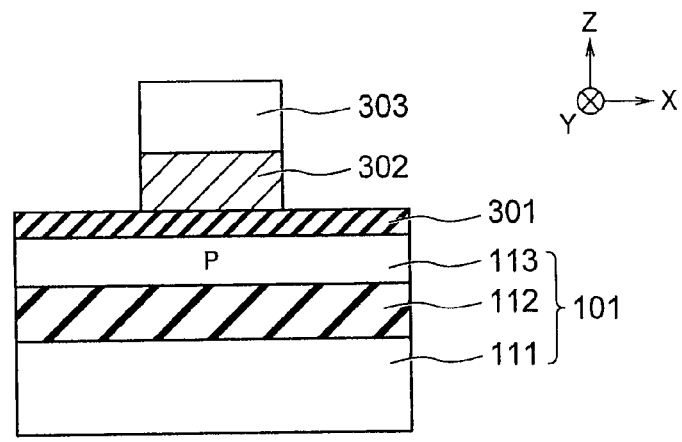
Figure 12C:
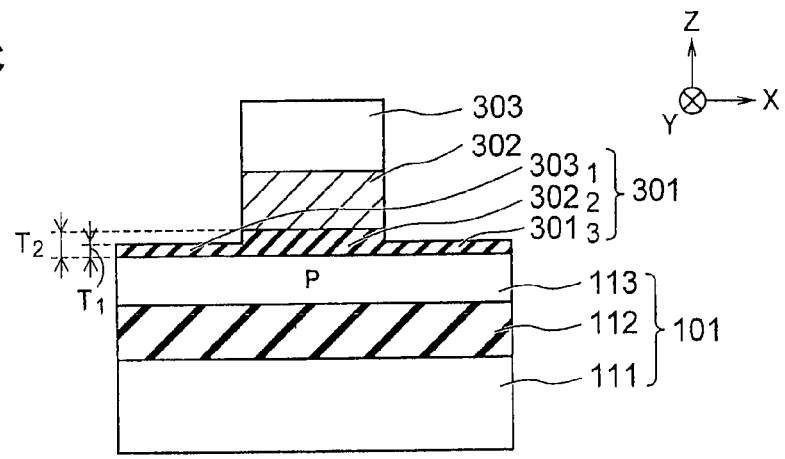
Figure 13A:
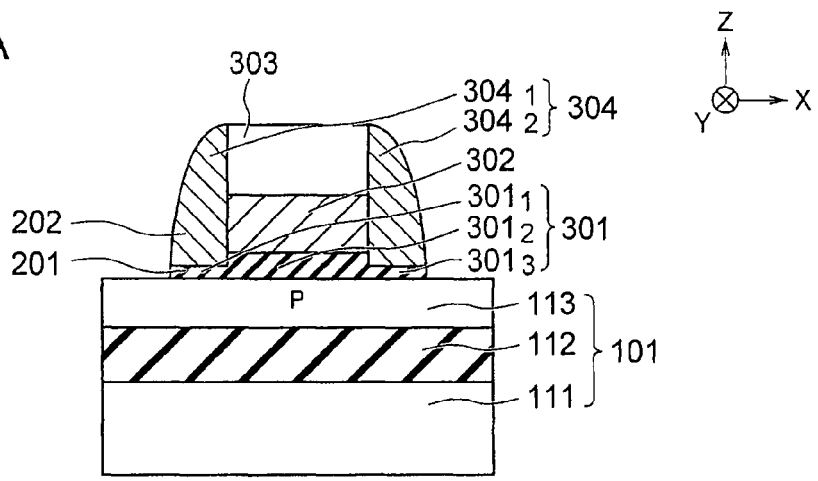
Figure 13B:
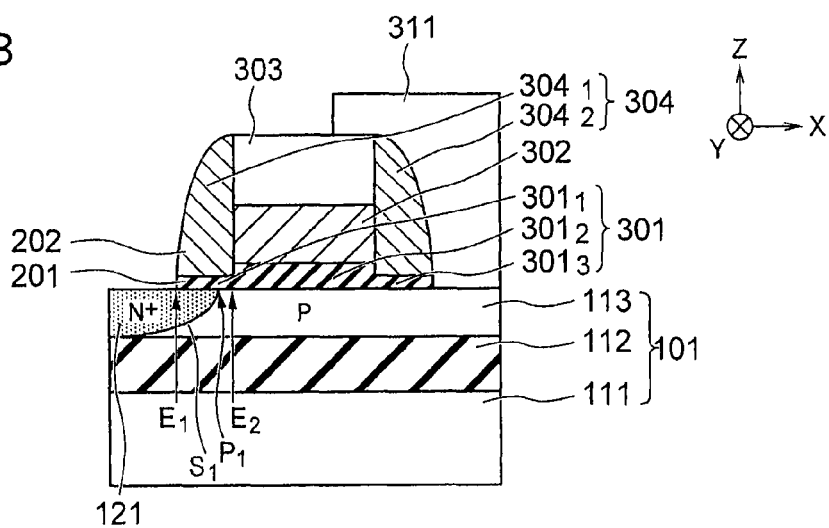
Figure 13C:
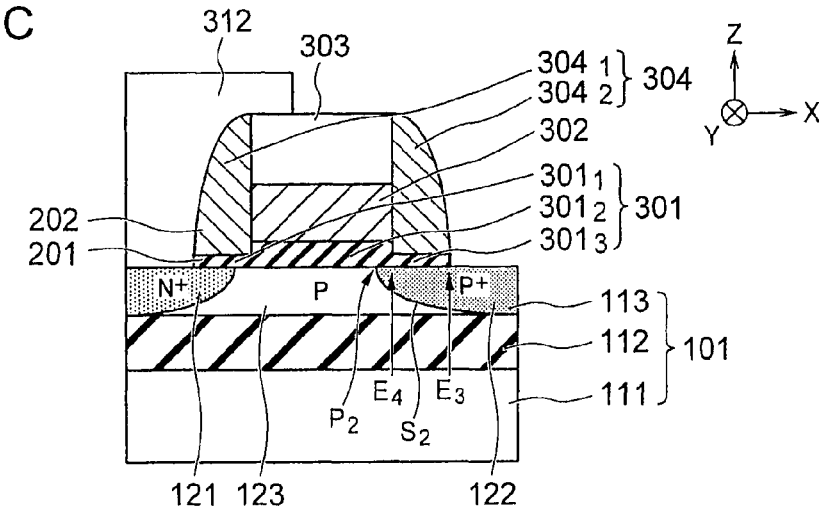

FIG. 11 is a cross-sectional view illustrating a structure of a semiconductor device of the third embodiment.

A gate insulator 201 of the present embodiment has such a structure in which only the first insulator portion $201_1$ of the first embodiment is included. This gate insulator 201 includes an edge $E_1$ parallel to the Y direction and positioned on a source region 121 and an edge $E_2$ parallel to the Y direction and positioned on a channel region 123, and has a first thickness $T_1$.

In addition, a gate electrode 202 of the present embodiment has such a structure in which only the second electrode portion $202_2$ of the first embodiment is included. Additionally, sidewall insulators 203 of the present embodiment are formed on both sidewall surfaces of this gate electrode 202 which are parallel to the Y direction.

Note that the arrangement of the source region 121, the drain region 122 and channel region 123 is the same as that in the first embodiment. It should be noted however that as the result of the position of the second sidewall insulator $203_2$ having been shifted toward the source region 121, the size of a drain region 122-side part of the silicide layer 131 is enlarged toward the source region 121.

Here, a comparison will be made between the effects of the semiconductor devices of the first and third embodiments.

In the first embodiment, the parasitic capacitance of the tunnel transistor is reduced by making the thickness of the second insulator portion $201_2$ thicker than the thickness of the first insulator portion $201_1$. On the other hand, in the third embodiment, since the tunnel transistor has a structure in which this second insulator portion $201_2$ is removed, the parasitic capacitance of the tunnel transistor is reduced further.

As described above, according to the third embodiment, it is possible to further reduce the parasitic capacitance of the tunnel transistor, thereby further improving the operation speed of the transistor, compared with the first embodiment.

Note that the gate length of the gate electrode 202 of the first embodiment is made longer than that of the third embodiment.

Consequently, according to the first embodiment, it is possible to make gate resistance lower, compared with the third embodiment. If gate resistance matters, however, in the third embodiment, the gate resistance can be lowered by changing the gate electrode 202 to a metal electrode.

(1) Method of Manufacturing Semiconductor Device of Third Embodiment

Next, a method of manufacturing the semiconductor device of the third embodiment will be described with reference to FIGS. 12A to 15. FIGS. 12A to 15 are cross-sectional views illustrating the method of manufacturing the semiconductor device of the third embodiment.

First, steps of FIGS. 12A to 13C are carried out in the same way as the steps of FIG. 3A to 4C. In the present embodiment, however, the first gate electrode material 302 is entirely removed in the end. Accordingly, it does not matter if a conductive or semiconductive material not suitable as an insulating material or a gate electrode material is used as the first gate electrode material 302.

Figure 14A:
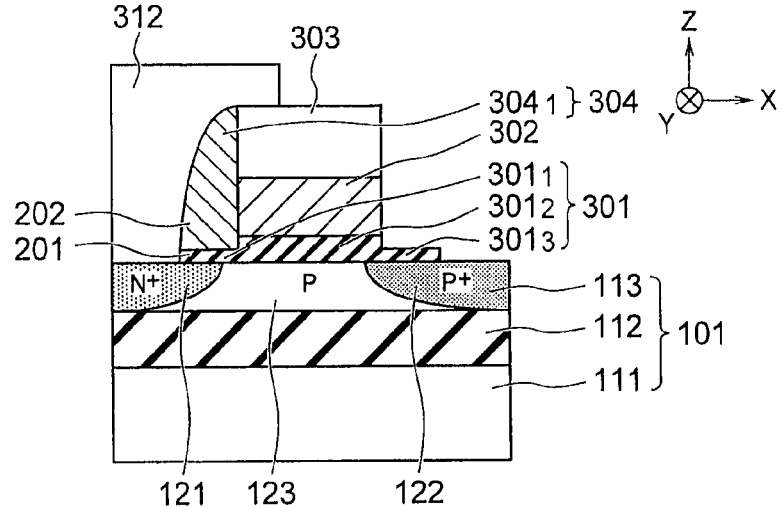

Next, in a step of FIG. 14A, the third electrode portion $202_3$ is removed using the resist film 312 as a mask in the same way as in the step of FIG. 5A.

Figure 14B:
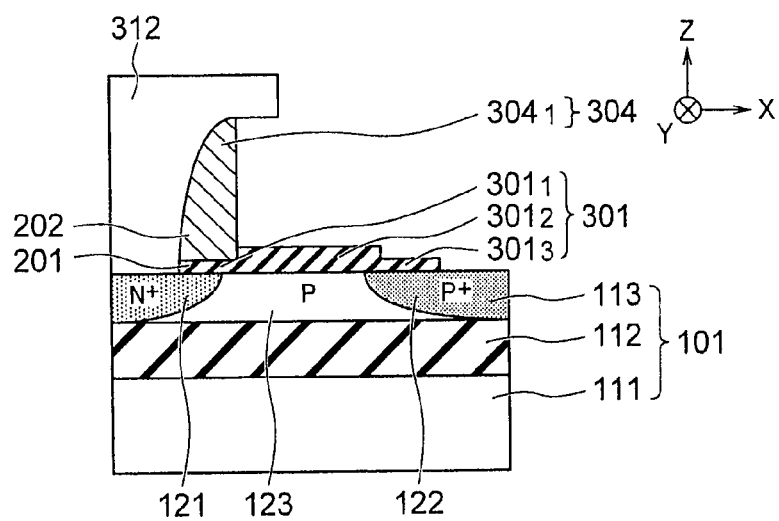

Next, in a step of FIG. 14B, the first gate electrode material 302 and the hard mask material 303 are removed by etching using the resist film 312 as a mask. Thereafter, the resist film 312 is separated off. Note that in order to perform this etching, the first gate electrode material 302 is desirably a material which allows an etching selection ratio to be set high with respect to the second gate electrode material 304. Consequently, the first gate electrode material 302 and the hard mask material 303 can be removed using the second gate electrode material 304 as a stopper.

Figure 14C:
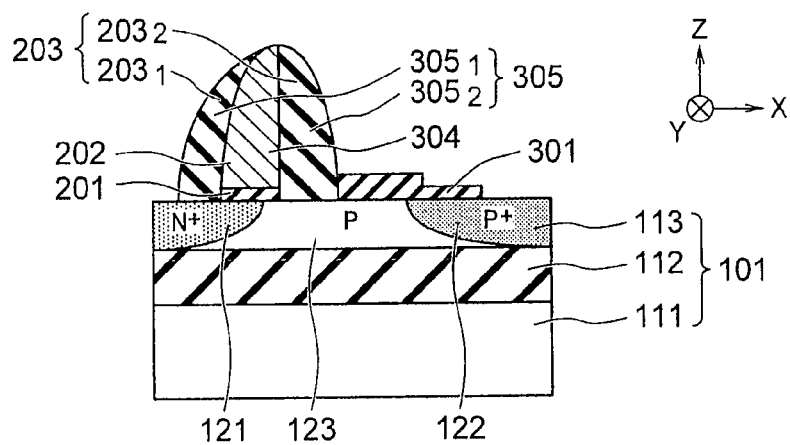
Figure 15:
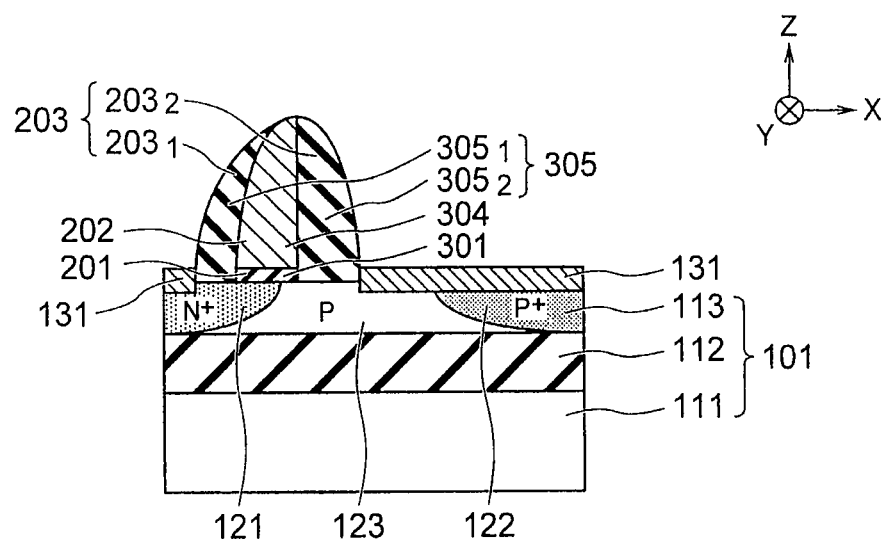

Next, as illustrated in FIG. 14C, a sidewall insulator material 305 is deposited on a substrate 101, and this sidewall insulator material 305 is etched. Consequently, a first sidewall insulator $203_1$ is formed on a source region 121-side sidewall surface of the two sidewall surfaces of the gate electrode 202, and a second sidewall insulator $203_2$ is formed on a channel region 123-side sidewall surface.

Thereafter, a step of FIG. 15A and subsequent steps are carried out in the same way as the step of FIG. 5C and subsequent steps in the first embodiment. In this way, the semiconductor device of FIG. 11 is completed.

As has been described heretofore, in the present embodiment, the gate insulator 201 is configured so as to include the edge $E_1$ parallel to the Y direction and positioned on the source region 121, and the edge $E_2$ parallel to the Y direction and positioned on the channel region 123. Consequently, in the present embodiment, it is possible to further reduce the parasitic capacitance of the tunnel transistor, thereby further improving the operation speed of the transistor, compared with the first and second embodiments.

Fourth Embodiment

Figure 16:
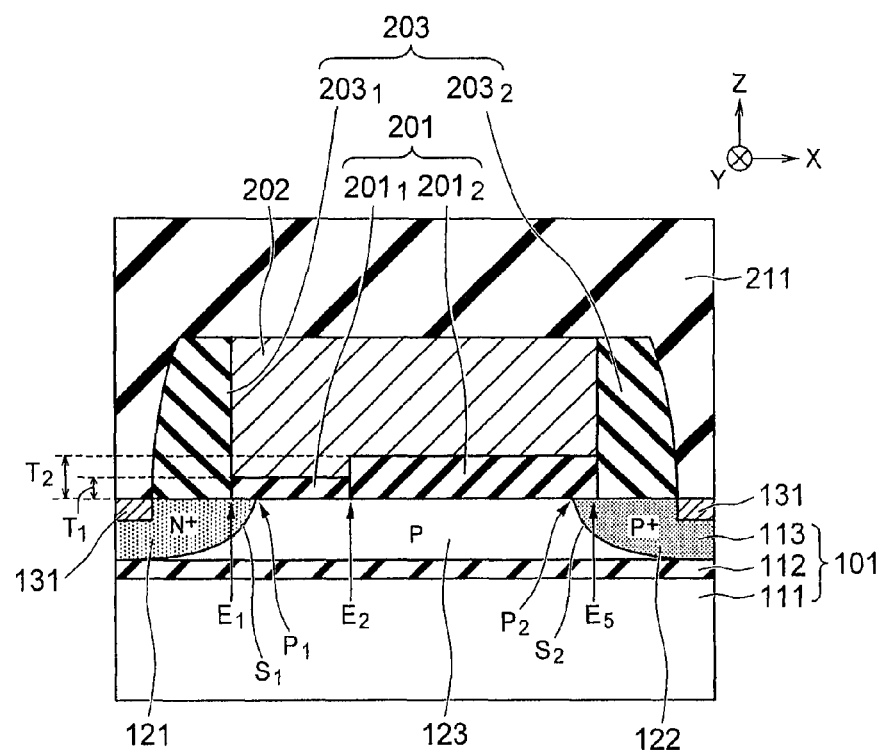
FIG. 16 is a cross-sectional view illustrating a structure of a semiconductor device of a fourth embodiment.

FIG. 16 is a cross-sectional view illustrating a structure of a semiconductor device of a fourth embodiment.

A gate insulator 201 of the present embodiment includes a first insulator portion $201_1$ having a first thickness $T_1$, and a second insulator portion $201_2$ having a second thickness $T_2$ greater than the first thickness $T_1$.

The first insulator portion $201_1$ includes an edge $E_1$ parallel to the Y direction and positioned on the source region 121, and an edge $E_2$ parallel to the Y direction and positioned on a channel region 123. Accordingly, the first insulator portion $201_1$ is positioned on a leading end $P_1$ of an interfacial boundary $S_1$ (PN junction) between the source region 121 and the channel region 123.

In addition, the second insulator portion $201_2$ is adjacent to the first insulator portion $201_1$ and is positioned on the drain region 122 side with respect to the first insulator portion $201_1$. In FIG. 16, an edge farther from the first insulator portion $201_1$ of the two edges of the second insulator portion $201_2$ parallel to the Y direction is denoted by $E_5$. This edge $E_5$ is positioned on a drain region 122. Accordingly, the second insulator portion $201_2$ is positioned on a leading end $P_2$ of an interfacial boundary $S_2$ between the drain region 122 and the channel region 123.

Additionally, a gate electrode 202 of the present embodiment has a structure in which the same gate electrode material is formed on the first insulator portion $201_1$ and the second insulator portion $201_2$. That is, a portion of the gate electrode 202 on the first insulator portion $201_1$ and a portion of the gate electrode 202 on the second insulator portion $201_2$ are formed of the same deposited film. As the material of the deposited film, an Si-containing material previously doped with an N or P-type impurity or a metal material, for example, is used.

Here, a comparison will be made between the effects of the semiconductor devices of the first and fourth embodiments.

In the first embodiment, a portion of the gate electrode 202 on the first insulator portion $201_1$ and a portion of the gate electrode 202 on the second insulator portion $201_2$ are formed of the first and second gate electrode materials 302 and 304, respectively.

On the other hand, in the fourth embodiment, the portion of the gate electrode 202 on the first insulator portion $201_1$ and the portion of the gate electrode 202 on the second insulator portion $201_2$ are formed of the same gate electrode material. Consequently, according to the fourth embodiment, there can be obtained the advantage of being able to reduce the amount of gate electrode material used and decrease the number of manufacturing steps of the semiconductor device, when compared with the first embodiment.

(1) Method of Manufacturing Semiconductor Device of Fourth Embodiment

Next, a method of manufacturing the semiconductor device of the fourth embodiment will be described with reference to FIGS. 17A to 19B. FIGS. 17A to 19B are cross-sectional views illustrating the method of manufacturing the semiconductor device of the fourth embodiment.

Figure 17A:
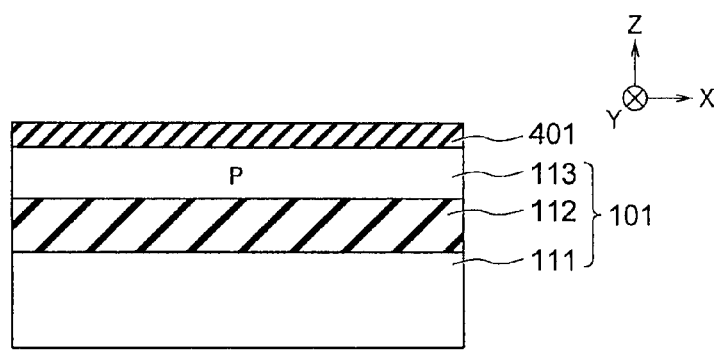
FIGS. 17A to 19B are cross-sectional views illustrating a method of manufacturing the semiconductor device of the fourth embodiment.

First, as illustrated in FIG. 17A, there is prepared a substrate 101 which is an SOI substrate. Next, as illustrated in FIG. 17A, a first gate insulator material 401 to serve as the material of the second insulator portion $201_2$ is thickly formed on the substrate 101. In the present embodiment, an $SiO_2$ film, for example, is used as the first gate insulator material 401.

Figure 17B:
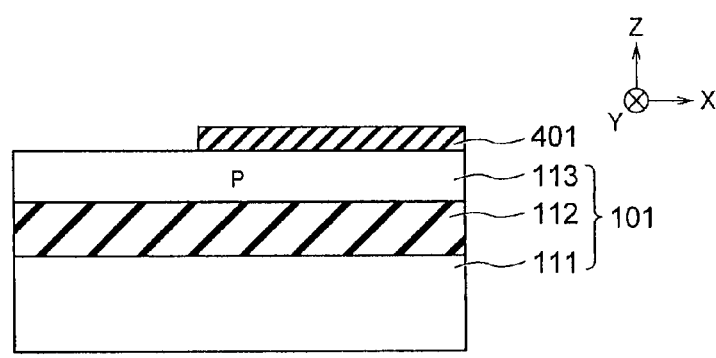

Next, as illustrated in FIG. 17B, part of the first gate insulator material 401 is removed by a patterning technique.

Figure 17C:
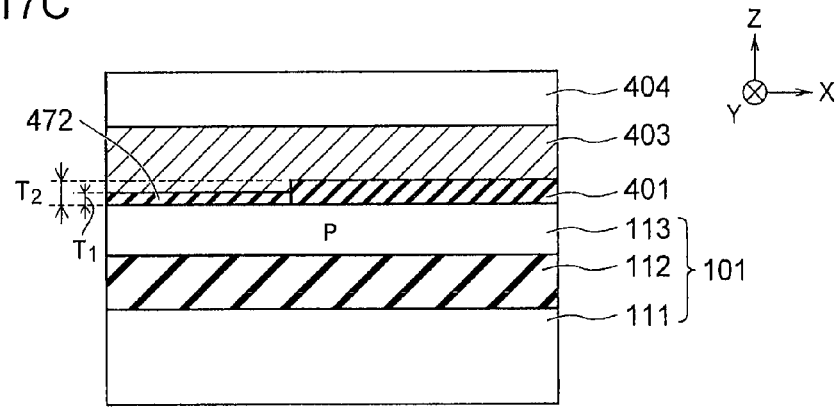

Next, as illustrated in FIG. 17C, a second gate insulator material 402 to serve as the material of the first insulator portion $201_1$ is thinly formed on the substrate 101. Consequently, a thin insulating layer and a thick insulating layer are formed on the substrate 101. In the present embodiment, an $SiO_2$ film, for example, is used as the second gate insulator material 402.

Next, as illustrated in FIG. 17C, a gate electrode material 403 to serve as the material of the gate electrode 202 and a hard mask material 404 are sequentially formed on the substrate 101 through the first and second gate insulator materials 401 and 402.

In the present embodiment, an Si-containing material previously doped with an N or P-type impurity, for example, is used as the gate electrode material 403. In this case, an $SiO_2$ film or an SiN film, for example, is used as the hard mask material 404. Note that a metal material may alternatively be used as the gate electrode material 403. In this case, it does not matter if the hard mask material 404 is not deposited on the gate electrode material 403.

Figure 18A:
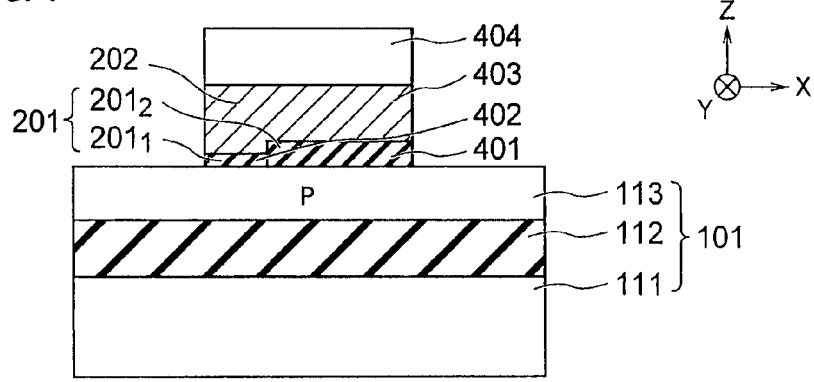
Figure 18B:
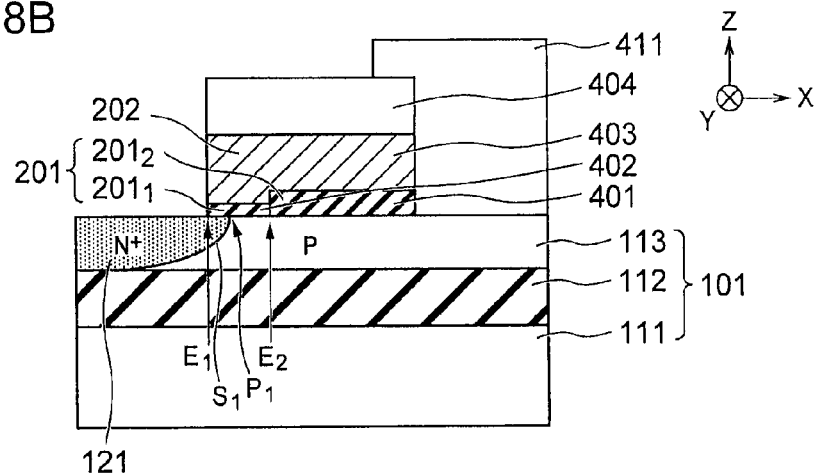

Next, as illustrated in FIG. 18A, the hard mask material 404 is patterned. Next, as illustrated in FIG. 18B, the gate electrode material 403 is patterned using the hard mask material 404 as a mask to form the gate electrode 202 encompassing the thin and thick insulating layers. At this time, these insulating layers are also patterned and the first and second insulator portions $201_1$ and $201_2$ are thereby formed.

Next, as illustrated in FIG. 18B, a second insulator portion $201_2$-side part of the substrate 101, i.e., a region in which the drain region 122 is to be formed is masked by a resist film 411. Next, an N-type impurity is ion-implanted into a second insulator portion $201_2$-side part of the substrate 101, i.e., a region in which the source region 121 is to be formed. Consequently, the source region 121 is formed in the substrate 101. Thereafter, the resist film 411 is separated off.

Figure 18C:
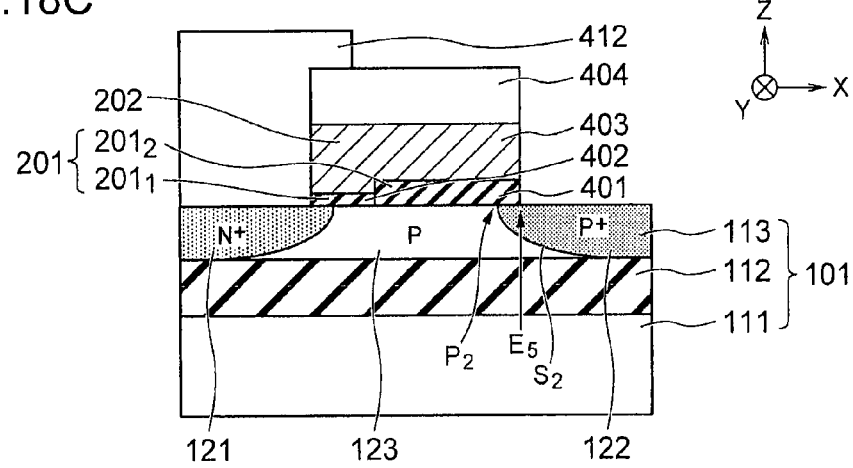

Next, as illustrated in FIG. 18C, the first insulator portion $201_1$-side part of the substrate 101, i.e., the region in which the source region 121 has been formed is masked by a resist film 412. Next, a P-type impurity is ion-implanted into a first insulator portion $201_1$-side part of the substrate 101, i.e., the region in which the drain region 122 is to be formed. Consequently, the drain region 122 is formed in the substrate 101. A region between the source region 121 and the drain region 122 in the substrate 101 serves as the channel region 123. Thereafter, the resist film 412 is separated off.

Figure 19A:
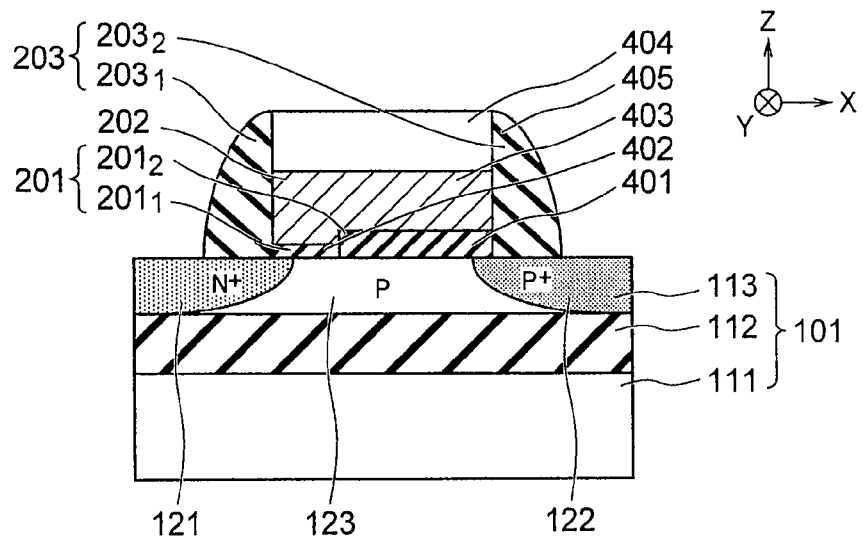

Next, as illustrated in FIG. 19A, a sidewall insulator material 405 is deposited on the substrate 101, and this sidewall insulator material 405 is etched. Consequently, a first sidewall insulator $203_1$ is formed on a first insulator portion $201_1$-side sidewall surface of the two sidewall surfaces of the gate electrode 202 and the hard mask material 404, and a second sidewall insulator $203_2$ is formed on a second insulator portion $201_2$-side sidewall surface. In the present embodiment, an $SiO_2$ film or an SiN film, for example, is used as the sidewall insulator material 405.

Figure 19B:
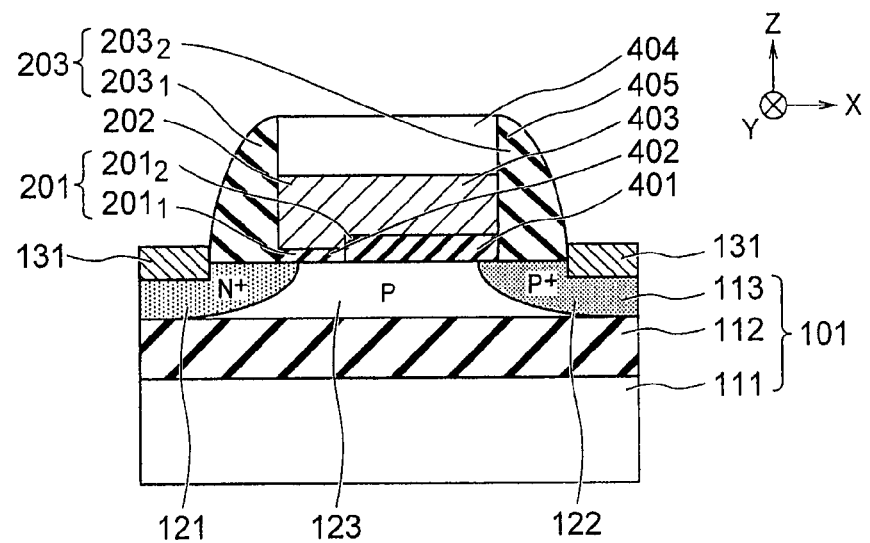

Thereafter, a step of FIG. 19B and subsequent steps are carried out in the same way as the step of FIG. 5C and subsequent steps in the first embodiment. In this way, the semiconductor device of FIG. 16 is completed.

As has been described heretofore, in the present embodiment, the gate insulator 201 is composed of the first insulator portion $201_1$ having the first thickness $T_1$ and the second insulator portion $201_2$ having the second thickness $T_2$ greater than the first thickness $T_1$, as in the first embodiment. In addition, the thickness of a portion of the gate insulator 201 farther from the PN junction $S_1$ is made greater than the thickness of a portion of the gate insulator 201 closer to the PN junction $S_1$. Consequently, in the present embodiment, it is possible to reduce the parasitic capacitance of the tunnel transistor and thereby improve the operation speed of the transistor.

In addition, in the present embodiment, the gate electrode 202 has a structure in which the same gate electrode material is formed on the first insulator portion $201_1$ and the second insulator portion $201_2$. Consequently, in the present embodiment, it is possible to reduce the amount of gate electrode material used and decrease the number of manufacturing steps of the semiconductor device.

While certain embodiments have been described, these embodiments have been presented by way of example only, and are not intended to limit the scope of the inventions. Indeed, the novel devices described herein may be embodied in a variety of other forms; furthermore, various omissions, substitutions and changes in the form of the devices described herein may be made without departing from the spirit of the inventions. The accompanying claims and their equivalents are intended to cover such forms or modifications as would fall within the scope and spirit of the inventions.

The invention claimed is:

1. A semiconductor device comprising:
a substrate;
a gate electrode provided on the substrate via a gate insulator;
a source region of a first conductivity type and a drain region of a second conductivity type provided in the substrate to sandwich the gate electrode, the second conductivity type being a reverse conductivity type of the first conductivity type; and
a channel region provided between the source region and the drain region in the substrate,
wherein
the gate insulator comprises:
a first insulator portion having a first edge which is positioned on the source region and is parallel to a channel-width direction, and a second edge which is positioned on the channel region or the source region and is parallel to the channel-width direction, and having a first thickness; and
a second insulator portion positioned on a drain region side with respect to the first insulator portion, and having a second thickness greater than the first thickness; and
the gate electrode comprises:
a first electrode portion provided on the second insulator portion, and formed of a first gate electrode material; and
a second electrode portion provided on the first insulator portion, formed of a second gate electrode material different from the first gate electrode material, and that is a sidewall film of the first electrode portion.

2. The device of claim 1, wherein a total width of the first and second insulator portions is 50 nm or greater.

3. The device of claim 1, wherein a width of the first insulator portion is smaller than a width of the second insulator portion.

4. The device of claim 1, wherein an edge of the second insulator portion on a opposite side of the first insulator portion is positioned on the drain region or the channel region.

5. The device of claim 1, wherein
the first insulator portion comprises $N_1$ layers of insulators where $N_1$ is an integer of one or more, and
the second insulator portion comprises $N_1+N_2$ layers of insulators where $N_2$ is an integer of one or more.

6. The device of claim 1, wherein each of the first and second insulator portions comprises a high-k insulator.

7. The device of claim 6, wherein the high-k insulator is a hafnium oxide film.

8. The device of claim 6, wherein the second insulator portion comprises a first insulator provided under the high-k insulator, and a second insulator provided on the high-k insulator and having a greater thickness than the first insulator.

9. The device of claim 1, wherein the gate insulator further comprises a third insulator portion positioned on the drain region side with respect to the second insulator portion, and having a third thickness different from the second thickness.

10. The device of claim 1, wherein a conductivity type of the channel region is the first conductivity type, the second conductivity type, or an intrinsic type.

11. The device of claim 1, wherein
an edge of the second insulator portion on a first insulator portion side is recessed toward an inner side of the first electrode portion with respect to a first side surface of the first electrode portion on a second electrode portion side, and
a part of the second electrode portion is buried in a space where the edge of the second insulator portion is recessed with respect to the first side surface.

12. The device of claim 11, wherein an edge of the second insulator portion on an opposite side of the first insulator portion is recessed toward an inner side of the first electrode portion with respect to a second side surface of the first electrode portion on an opposite side of the second electrode portion.

13. The device of claim 12, wherein the gate electrode further comprises a third electrode portion buried in a space where the edge of the second insulator portion is recessed with respect to the second side surface.

14. The device of claim 1, further comprising a pocket region of the second conductivity type provided in the source region under the gate electrode.

15. A semiconductor device comprising:
a substrate;
a gate electrode provided on the substrate via a gate insulator;
a source region of a first conductivity type and a drain region of a second conductivity type provided in the substrate to sandwich the gate electrode, the second conductivity type being a reverse conductivity type of the first conductivity type; and
a channel region provided between the source region and the drain region in the substrate;
wherein the gate insulator comprises:
a first insulator portion having a first edge which is positioned on the source region and is parallel to a channel-width direction, and a second edge which is positioned on the channel region or the source region and is parallel to the channel-width direction, and having a first thickness;
a second insulator portion positioned on a drain region side with respect to the first insulator portion, and having a second thickness greater than the first thickness; and
a third insulator portion positioned on the drain region side with respect to the second insulator portion, and having a third thickness different from the second thickness.

16. The device of claim 15, wherein a width of the third insulator portion is smaller than a width of the second insulator portion.

17. The device of claim 15, wherein a width of the third insulator portion is substantially equal to a width of the first insulator portion.

18. The device of claim 15, further comprising a sidewall insulator provided on a sidewall surface of the gate electrode on the third insulator portion.

* * * * *